(12) United States Patent
Jerecic et al.

(10) Patent No.: US 9,568,579 B2
(45) Date of Patent: Feb. 14, 2017

(54) MAGNETIC RESONANCE FINGERPRINTING (MRF) WITH ECHO SPLITTING

(71) Applicant: Case Western Reserve University, Cleveland, OH (US)

(72) Inventors: Renate Jerecic, Erlangen (DE); Mark Griswold, Shaker Heights, OH (US); Yun Jiang, Cleveland Heights, OH (US); Dan Ma, Cleveland Heights, OH (US)

(73) Assignees: Case Western Reserve University, Cleveland, OH (US); SIEMENS AG, Erlangen (DE)

( * ) Notice: Subject to any disclaimer, the term of this patent is extended or adjusted under 35 U.S.C. 154(b) by 660 days.

(21) Appl. No.: 14/024,999

(22) Filed: Sep. 12, 2013

(65) Prior Publication Data
US 2014/0167754 A1    Jun. 19, 2014

Related U.S. Application Data

(60) Provisional application No. 61/739,311, filed on Dec. 19, 2012.

(51) Int. Cl.
| | |
|---|---|
| *G01V 3/00* | (2006.01) |
| *G01R 33/56* | (2006.01) |
| *G01R 33/561* | (2006.01) |
| *G01R 33/50* | (2006.01) |

(52) U.S. Cl.
CPC .............. *G01R 33/56* (2013.01); *G01R 33/561* (2013.01); *G01R 33/50* (2013.01); *G01R 33/5602* (2013.01)

(58) Field of Classification Search
CPC ....... G01R 33/56; G01R 33/561; G01R 33/50; G01R 33/5602
USPC ......................................................... 324/309
See application file for complete search history.

(56) References Cited

U.S. PATENT DOCUMENTS

| 5,541,511 | A * | 7/1996 | Hennig | G01R 33/5615 324/309 |
|---|---|---|---|---|
| 6,034,528 | A * | 3/2000 | Heid | G01R 33/561 324/309 |
| 8,384,384 | B2 * | 2/2013 | Zhao | G01R 33/4824 324/309 |
| 8,941,381 | B2 * | 1/2015 | Feinberg | G01R 33/5615 324/309 |

(Continued)

*Primary Examiner* — Susan Lee
(74) *Attorney, Agent, or Firm* — Quarles & Brady LLP

(57) ABSTRACT

Apparatus, methods, and other embodiments associated with nuclear magnetic resonance (NMR) fingerprinting using echo splitting are described. One example apparatus includes an NMR logic configured to repetitively and variably sample a (k, t, E) space associated with an object to acquire a set of NMR signals. Members of the set of NMR signals are associated with different points in the (k, t, E) space. Sampling is performed with t and/or E varying in a non-constant way. The varying parameters may include the number of echo splitting pulses, spacings between echo splitting pulses, flip angle of echo splitting pulses, echo time, RF amplitude, and other parameters. The NMR apparatus may also include a signal logic configured to produce an NMR signal evolution from the NMR signals, and a characterization logic configured to characterize a resonant species in the object as a result of comparing acquired signals to reference signals.

50 Claims, 13 Drawing Sheets

(56) References Cited

U.S. PATENT DOCUMENTS

2009/0251140 A1* 10/2009 Bhardwaj .......... G01R 33/5616
  324/307
2011/0241671 A1* 10/2011 Zhao ................. G01R 33/4824
  324/309
2015/0301138 A1* 10/2015 Griswold ......... G01R 33/56563
  324/309

* cited by examiner

MAGNETIC RESONANCE FINGERPRINTING (MRF) WITH ECHO SPLITTING

CROSS-REFERENCE TO RELATED APPLICATIONS

This application claims the benefit of U.S. Provisional Application 61/739,311 filed Dec. 19, 2012, by the same inventors.

FEDERAL FUNDING NOTICE

This invention was developed, at least partially, with federal funding supplied under Federal Grant No. 1R01HL094557 provided by the NIH, Federal Grant No. 5K99EB0111527 provided by the NIH, and Federal Grant No. 1KL2RR024990 provided by the NIH. The Federal government has certain rights in the invention.

BACKGROUND

Conventional magnetic resonance imaging (MRI) seeks to produce a single echo having a constant signal at a single point in time. Conventional MRI sequences may use a fixed set of flip angles to generate a signal at a single echo time (TE). However, application of multiple radio frequency (RF) pulses in a pulse sequence may produce multiple spin and stimulated echoes at times other than just the desired TE. Conventionally, these higher echo pathways are either refocused or spoiled to help the single desired signal reach a steady state.

Conventional magnetic resonance (MR) pulse sequences include a preparation phase, a waiting phase, and an acquisition phase that are configured to produce steady state signals from which images can be made. The preparation phase determines when a signal can be acquired and determines the properties of the acquired signal. For example, a first pulse sequence may be designed to produce a T1-weighted signal at a first echo time (TE) while a second pulse sequence may be designed to produce a T2-weighted signal at a second TE, where T1 is spin-lattice relaxation and T2 is spin-spin relaxation. These conventional pulse sequences are typically designed to provide qualitative results where data are acquired with various weightings or contrasts that highlight a particular parameter (e.g., T1 relaxation, T2 relaxation).

MR fingerprinting (MRF) takes a different approach. MRF sequences seek to generate unique signal evolutions using a combination of different acquisition parameters. MRF simultaneously generates quantitative maps by analyzing acquired spatially and temporally incoherent signals in light of a pre-calculated dictionary. Instead of working to produce a constant signal, MRF embraces signal dynamics by varying acquisition parameters. For example, flip angle and repetition time may be varied to generate unique signal evolutions for different tissue types.

MRF is described in Ma D, Gulani V, Seiberlich N, Liu K, Sunshine J, Duerk J, and Griswold M. Magnet Resonance Fingerprinting, Nature, 495:187-192 (2013). MRF is also described in U.S. patent application Ser. No. 13/051,144 filed Mar. 18, 2011 by Griswold et al., and in U.S. patent application Ser. No. 13/623,104 filed Sep. 19, 2012 by Griswold et al.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 10a illustrates an example acquisition sequence diagram. FIG. 10b illustrates an example of flip angle (FA) and repetition time (TR) patterns.

FIG. 11a illustrates simulated signal evolution curves corresponding to four normal tissues of the brain. FIG. 11b illustrates one example of acquired signal evolution curves and its comparison to a dictionary. FIG. 11c illustrates $T_1$ and $T_2$ values retrieved from a matching algorithm.

FIG. 12a illustrates a T1 map (ms), FIG. 12b illustrates a T2 map (ms), FIG. 12c illustrates an off-resonance map (Hz), and FIG. 12d illustrates a proton density map.

DETAILED DESCRIPTION

Figure 1:
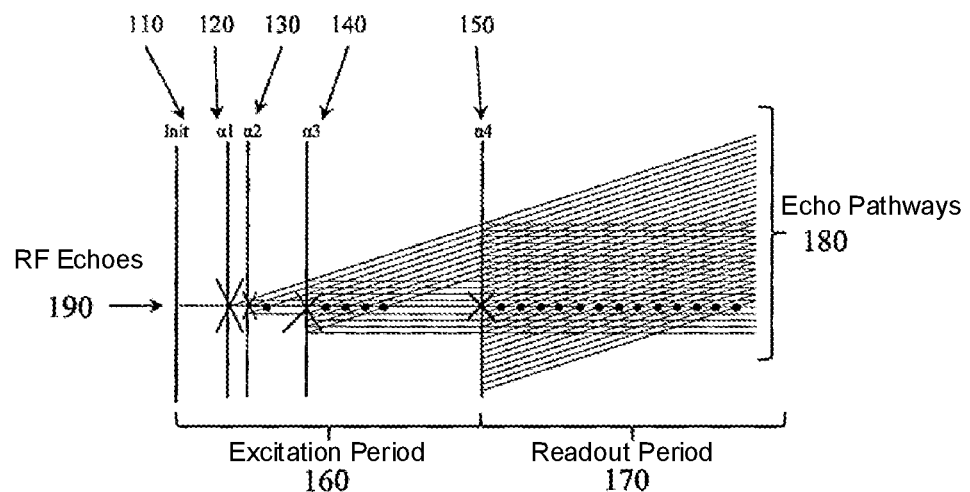
FIG. 1 illustrates multiple echo pathways associated with a split echo sequence.

Conventional MRI sequences seek to produce a single echo path with a constant signal at a well-defined echo time (TE). MRI sequences that use echo splitting seek to produce multiple echo paths having different signals and characteristics over a period of time. Echo splitting MRF sequences seek to produce different sets of multiple echo paths. One example echo splitting technique is Quick Echo Split Technique (QUEST), which is described in Heid 0, Deimling M, and Huk W. QUEST—A Quick Echo Split NMR Imaging Technique, *Magn Reson Med* 1993; 29:280-283, and in Jerečić R, Bock M, and Schad LR. An amplitude optimized single-shot hybrid QUEST technique. *Magn Reson Imaging* 2000; 18:23-32.

Example echo splitting approaches may be referred to as aperiodic stepped pulse approaches or generalized stepped pulse approaches. The echo splitting approach recognizes that one magnetization produced in an object can be divided to produce multiple echo paths. In one example, the magnetization can be repeatedly divided to produce the multiple echo paths. Repeated de-phasing and excitation may be employed to divide the magnetization into an exponentially growing number of echoes. In one example, one magnetization can produce up to $3^k$ echo paths, where k is the number of echo splitting RF pulses. In this approach, the number of RF pulses and gradient lobes is a logarithmic function of the echo number rather than a linear function of the echo number. For example, $N=\frac{2}{3} *3^k$ paths may be gradient recallable and thus used for imaging. Since this number grows so quickly, in different embodiments, a small number (e.g., 4, 6) may be used for k.

In one echo splitting approach, the application of a single RF pulse with an arbitrary flip angle α splits a single path of phase φ into three parts. In one example, the maximum achievable number of echoes generated by m appropriately spaced RF pulses with k refocusing 180° pulses is $k*3^{m-k-1}$, where k and m are integers. In one example, additional improvements result when a constant readout gradient is applied during an acquisition phase rather than switching gradients during readout. Thus, in one embodiment, there may be no gradient field switching during echo sampling.

Example apparatus and methods may perform magnetic resonance fingerprinting (MRF) on signals acquired from the multiple echo paths generated by echo splitting magnetization using a number of echo splitting (e.g., flip angle) excitations. The MRF may involve identifying correlations between the acquired signals and information stored in a pre-calculated dictionary. Since multiple echo paths can be acquired simultaneously, acquisition time may be dramatically reduced and the amount of novel information acquired per unit time may be dramatically increased over single echo path systems. Since multiple echo paths can be generated from a smaller number (e.g., 4) RF pulses, RF deposition and specific absorption rate (SAR) may be dramatically reduced over single echo path systems. Since different sets of multiple echo paths can be acquired by varying the number of echo splitting excitations (e.g., RF pulses), by varying the spacing between echo splitting excitations, or by varying the flip angles of echo splitting excitations, a rich set of signals can be acquired in an extremely short period of time compared to conventional systems.

Example apparatus and methods use an echo splitting technique to cause resonant species in a material to which NMR excitations are applied to generate, in parallel, multiple different signal evolutions. The term "resonant species", as used herein, refers to an item (e.g., water, fat, tissue, material) that can be made to resonate using nuclear magnetic resonance (NMR). The multiple different signal evolutions can be collected over a period of time to identify a signal evolution for the material. In one embodiment, resonant species in the material can then be characterized by analyzing the signal evolution in light of known evolutions. In one embodiment, the "known" evolutions may be, for example, simulated evolutions and/or previously acquired evolutions. Characterizing the resonant species can include identifying different properties of a resonant species (e.g., T1, T2, diffusion resonant frequency, diffusion co-efficient, spin density, proton density). Additionally, other properties including, but not limited to, tissue types, materials, superposition of attributes (e.g., T1, T2) can be identified.

In one embodiment, apparatus and methods may perform MRF using QUEST. This may be referred to as QUEST MRF. In one embodiment, the QUEST MRF may employ a spiral trajectory to simultaneously generate T1, T2, and M0 maps, where M0 refers to net magnetization. Other trajectories may be employed. In one embodiment, QUEST MRF may yield unique signal evolutions by acquiring an increased number of echoes from a limited number of RF pulses as compared to conventional systems. In one embodiment, QUEST MRF maximizes the ratio of echoes produced by a pulse sequence to the number of RF pulses in the pulse sequence. In one embodiment, QUEST MRF may include a 180 degree pulse and perform various acceleration techniques (e.g., iterative reconstruction). In one embodiment, QUEST MRF may include performing time resolved acquisitions.

As compared to conventional MRF, QUEST MRF facilitates easier integration of other parameters into the MRF framework. For example, it may be difficult, if even practically possible at all, to integrate significant sensitivity to self-diffusion into a TrueFISP-based MRF framework. The integration may be difficult because diffusion sensitivity requires fully balanced gradients per repetition time (TR) in a TrueFISP-based implementation. The requirement for fully balanced gradient per TR may lead to using quick bi-polar gradients, which in turn limits the total diffusion weighting possible. Conversely, since QUEST MRF relies, to some extent, on having unbalanced gradients, in one embodiment, QUEST MRF may employ large, unbalanced mono-polar gradients.

In one embodiment, QUEST MRF separates echo pathways by increasing the delay between the RF pulses according to $T_n=3^{n-1}T_0$, where $T_0$ denotes the minimal duration between the RF pulses. More generally, QUEST MRF may employ increasing spacings between the RF pulses or, after a set of echo pathways have been established, may have constant RF pulse spacing. From one point of view, TR in QUEST may be considered to be the spacings between pulses. Example sequences may vary flip angle, minimum TR, or other parameters to generate unique signal evolutions for different resonant species (e.g., tissues) in a sample. The separate echo pathways may be acquired using, for example, a variable spiral trajectory. Other trajectories may also be employed.

Application of multiple RF pulses produces multiple spin and stimulated echoes. Conventionally, these are ignored or even cancelled by spoiling or refocusing. Split echo techniques embrace these multiple echoes and paths. Split echo techniques try to separate out and use the multiple echo paths. Consider the following:

$$\begin{pmatrix} M_{xy} \\ M_{xy}^* \\ M_z \end{pmatrix}^+ = \begin{pmatrix} \frac{1+\cos\alpha}{2} & \frac{1-\cos\alpha}{2}i\sin\alpha \\ \frac{1-\cos\alpha}{2} & \frac{1+\cos\alpha}{2}i\sin\alpha \\ \frac{i\sin\alpha}{2} & \frac{-i\sin\alpha}{2}\cos\alpha \end{pmatrix} \begin{pmatrix} M_{xy} \\ M_{xy}^* \\ M_z \end{pmatrix}^-$$

with the flip angle α not an integer multiple of 90°, the matrix entries are non-zero. Therefore, from a single path $M_{xy}^+$ or $M_{xy}^{*+}$ or $M_z^+$ of arbitrary phase φ, there can be three paths:

$M_{xy}^+$ with unchanged phase φ and inverted phase −φ
$M_{xy}^{*+}$ with unchanged phase φ and inverted phase −φ
$M_z^+$ of phase |φ|.

FIG. 1 shows echo pathways 180 resulting from an echo splitting sequence with 5 RF pulses. FIG. 1 illustrates that up to 18 spin echoes, and 4 RF echoes (FIDs) are generated from just the 5 RF pulses. The RF echoes, which are represented by x's on the horizontal line 190, have different T1 and T2 weighting. Having different T1 and T2 weighting may enhance MRF.

FIG. 1 illustrates an echo splitting technique that includes an excitation period 160 and a readout period 170. The echo splitting technique produces multiple echo paths 180. In one embodiment, a first 90° RF pulse 110 is used to excite longitudinal magnetization. While first RF pulse 110 is illustrated as a 90° RF pulse, in different embodiments the first RF pulse 110 may be a different number of degrees. A magnetic field gradient may be used to separate echo phases and to define the readout direction. RF pulses $\alpha 1$ 120, $\alpha 2$ 130, and $\alpha 3$ 140 may have different flip angles. RF pulses $\alpha 1$ 120, $\alpha 2$ 130, and $\alpha 3$ 140 may be used to multiply the number of distinct echo paths. RF pulses $\alpha 1$ 120, $\alpha 2$ 130, and $\alpha 3$ 140 have flip angles that are not integer multiples of 90°. RF pulses $\alpha 1$ 120, $\alpha 2$ 130, and $\alpha 3$ 140 split echoes generated by the initial 90° pulse 110. RF pulses $\alpha 1$ 120, $\alpha 2$ 130, and $\alpha 3$ 140 may excite and split additional magnetizations. RF pulse $\alpha 4$ 150 may be used to end the excitation period 160 with a selective RF inversion of the echo paths 180. This selective RF inversion may refocus just the slice of interest. During the excitation period 160, transverse paths Mxy may decay by T2 while stimulated paths Mz may decay by T1.

In one example, during readout period 170, a readout gradient may be applied to facilitate acquiring the spin echoes. The spin echoes are represented by the black dots on the horizontal line 190. In one embodiment, the readout gradient may be a constant gradient. The x's on horizontal line 190 represent RF echoes.

In one experiment performed to analyze QUEST MRF, a 4 RF pulse QUEST block was repeated 15 times. The minimal RF duration (10-13 ms) and flip angles (0-60 degrees) were varied randomly. This produced a highly variable signal. Experiments were performed with phantoms having a wide range of T1 (60-1800 ms) and T2 (30-200 ms) values. Experiments were performed on a Siemens Magnetom Espree 1.5T (Siemens AG Medical Solutions, Erlangen, Germany). A dictionary of the signal evolutions with a range of T1 (50-2000 ms) and T2 (10-300 ms) values was created using the Bloch simulation.

In the experiment, pattern recognition was used to select elements from the dictionary that were represented by the acquired signals. In different embodiments, different comparison and selection approaches may be employed. The comparisons and selections yielded information concerning T1, T2, and proton density, with the information being suitable for imaging, diagnostic, or other purposes. The QUEST MRF performance was evaluated using sequences including a saturation recovery spin-echo (13 TRs ranging from 50 ms to 5000 ms with TE of 8.5 ms) and fast spin echo (15 echoes with TEs from 15 ms to 225 ms with TR of 10 secs). The evaluation sequences facilitated quantifying T1 and T2 values, respectively, in the phantoms. In one evaluation, T1 and T2 values were calculated by a pixel-by-pixel three-parameter nonlinear least squares fitting. Different fittings may be used in different evaluations and in different comparisons. The evaluations revealed that the QUEST MRF approach provided information suitable for imaging, diagnostic, or other purposes faster than conventional approaches.

Figure 2:
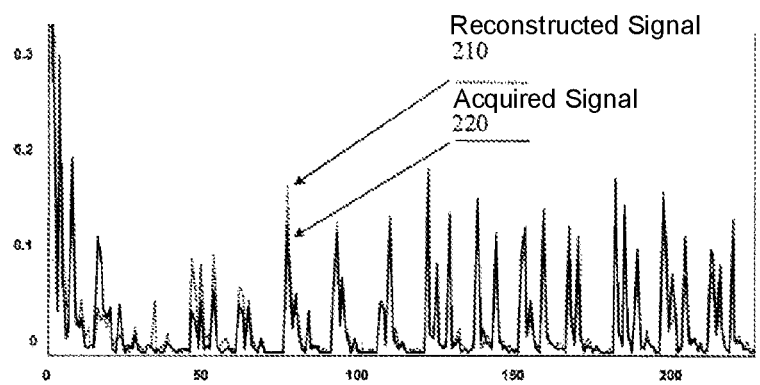
FIG. 2 illustrates an example signal evolution from an acquired signal and an MRF reconstructed signal.

FIG. 2 illustrates an example signal evolution from an acquired signal 220 and an MRF reconstructed signal 210. The acquired signal 220 is shown as a solid line and the reconstructed signal 210 is shown as a dotted line. FIG. 2 shows the signal time course from one pixel of acquired signal and a corresponding dictionary entry.

Figure 13:
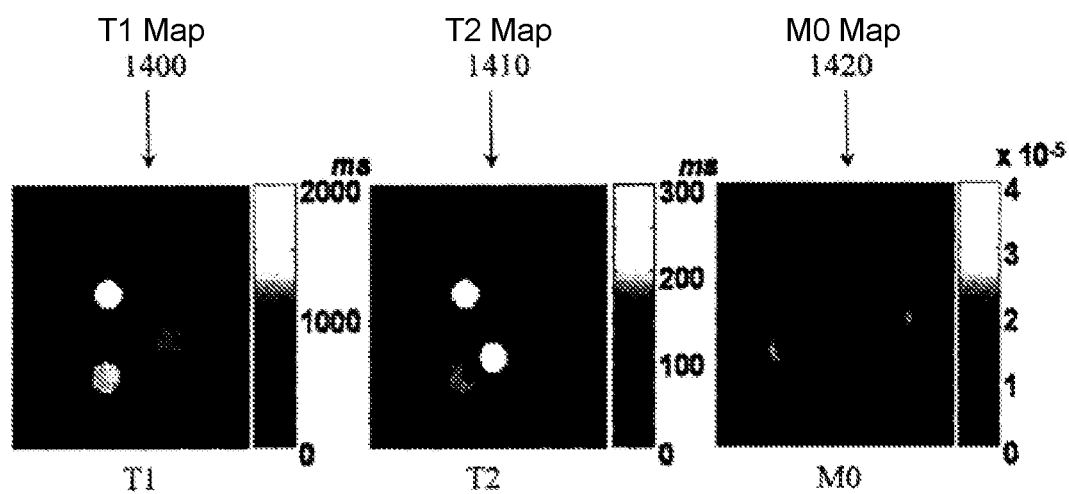
FIG. 13 illustrates T1, T2, and M0 (net magnetization) maps generated from MRF using echo splitting.

FIG. 13 illustrates a T1 map 1400, a T2 map 1410, and an M0 map 1420 simultaneously generated from QUEST MRF. These maps illustrate results possible with an echo splitting approach.

Figure 14:
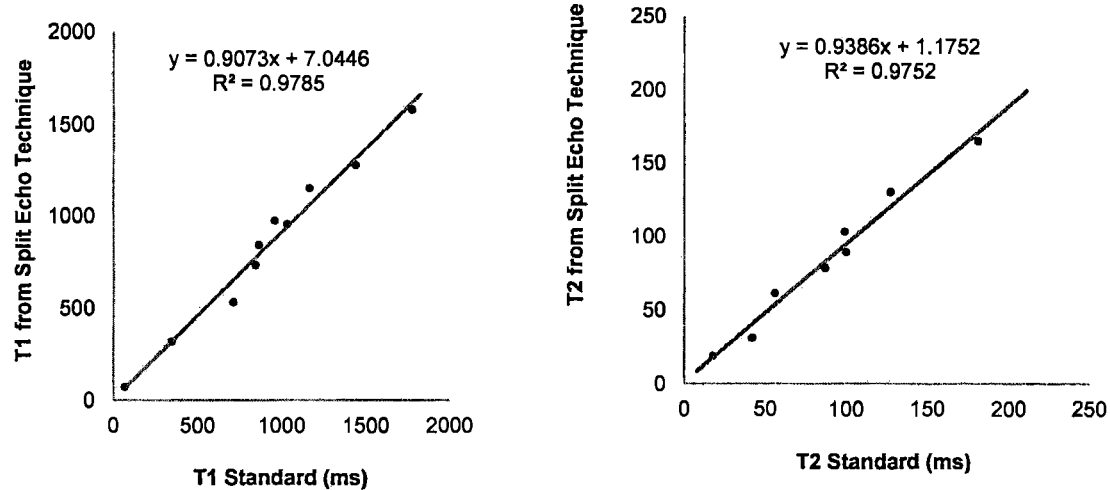
FIG. 14 compares T1 and T2 values obtained from an MRF with echo splitting method and a spin echo method.

FIG. 14 compares T1 (left) and T2 (right) values obtained from QUEST MRF and spin echo methods. FIG. 14 shows that T1 and T2 values acquired using QUEST MRF agree well with T1 and T2 values acquired using a conventional method.

QUEST, and other echo splitting approaches, facilitate separating echo pathways to generate specific MRF signatures for relaxation parameters. QUEST MRF facilitates reducing the number of RF pulses used in a sequence even while increasing the number of echoes received in response to the reduced number of RF pulses. This facilitates reducing acquisition time. Additionally, QUEST MRF and other echo splitting approaches reduce the specific absorption rate (SAR), which may facilitate using MRF at 7T and above.

In one embodiment, QUEST MRF may be employed to quantify perfusion. In another embodiment, QUEST MRF may be employed to quantify diffusion. In different embodiments, other parameters may be quantified.

In one embodiment, characterizing resonant species may be performed by comparing first information to second (e.g., reference, stored) information. The first information may include the acquired NMR signals, the acquired signal evolution(s), or information derived from the acquired NMR signals or acquired signal evolution(s). The second information may include a stored signal evolution, a known signal evolution, a modeled signal evolution, information derived from stored signal evolutions, or information that is not a signal evolution. Deriving information from a signal evolution may include, for example, transforming a signal evolution, transforming two or more signal evolutions, combining signal evolutions, decomposing a signal evolution, decomposing two or more signal evolutions, and other mathematical or other transformations.

Comparing the first information to the second information may be performed in various ways including, but not limited to, pattern matching, selection, minimization of a cost function, and optimization. Pattern matching may include, but is not limited to, orthogonal matching pursuit (OMP), categorical sequence labeling, regression, clustering, classification, real value sequence labeling, parsing algorithms, Bayesian methods, Markov methods, ensemble learning methods, and template matching. Optimization may include, but is not limited to, least squares optimization, regularized least squares optimization, basis pursuit optimization, and matching pursuit optimization.

The result of the comparison may take different forms. In different embodiments, the result of the comparison may include, but is not limited to, an identification that the first information matches the second information, an identification that the first information matches the second information to within a tolerance, and an identification that there is a certain percent likelihood that the first information matches the second information. In other embodiments, the result of the comparison may include, but is not limited to, an identification of T1 for a resonant species, an identification of T2 for a resonant species, an identification of a diffusion coefficient, an identification of a spin density, an identification of a resonance frequency (e.g., chemical shift) and an identification of a proton density. In another embodiment, the comparison may include identifying the strength of a magnetic field (e.g., B0, B) or may include identifying the strength of a gradient field. In yet another embodiment, the result of the comparison may identify a tissue type (e.g., brain, brain tumor) or may identify a material. Thus, the comparison may produce different results. In one embodiment, multiple results may be provided. For example, a weighted list of likely materials may be provided. In another example, multiple probabilities may be provided.

Example apparatus and methods do not define what the signals produced by the resonant species must be, only that the signals be different between different resonant species being examined. Unlike conventional systems, the different NMR signals may not have constant signal strength or phase. Since tissues or other materials may produce different signals, in one embodiment, the process of characterizing the tissues or other materials is reduced to pattern recognition in the signal time course. The pattern recognition may be performed using, for example, different variations of Orthogonal Matching Pursuit (OMP). In one embodiment, pattern matching may lead to a conclusion that an acquired signal evolution matches a known signal evolution to within a desired tolerance. In another embodiment, pattern matching may identify a probability that a known signal evolution matches the acquired signal evolution. In another embodiment, comparing may lead to a conclusion that an acquired signal evolution or information that is a function of an acquired signal evolution matches a known signal evolution or information that is a function of one or more known signal evolutions to within a desired tolerance. In yet another embodiment, comparing may identify a probability that an acquired signal evolution or information that is a function of an acquired signal evolution matches a known signal evolution or information that is a function of one or more known signal evolutions.

Example apparatus and methods facilitate maximizing contrast between resonant species without ignoring resonant species that may be in the volume or object. Thus, NMR fingerprinting involves applying a series of varied sequence blocks that generates a particular signal evolution signature (e.g., fingerprint) that is specific for a particular combination of parameters and resonant species in a volume. The signature may be a function of one or more of the multiple echo paths produced by echo splitting. Processing performed on received signals does not necessarily involve conventional reconstruction, but rather involves analyzing the received NMR signals or determined signal evolution in light of known information including, but not limited to, signal evolutions, information derived from signal evolutions, and other information.

If a volume only has water, then the volume will only produce one signal. If the volume only has fat, then the volume will also only produce one signal, but it will be a different signal. Different amounts of fat and water in the same volume will yield different signals. The combination of signals acquired under different conditions may yield nearly infinitely unique signal evolutions. While the human body is a complicated thing, from a certain point of view it is not that complicated. Every volume in a human body can only hold a finite set of things arranged in a finite set of ways. Over time, a comprehensive library of reference information including, but not limited to, signal evolutions associated with many of the most relevant combinations of resonant species may be acquired and be available to NMR fingerprinting apparatus.

The library may store signals that may be referred to as baseline signatures or known signal evolutions. In different embodiments, the library may store simulated and/or predicted signal evolutions. Thus, in different examples, "known" signal evolutions may include previously acquired signal evolutions and/or simulated signal evolutions. Additionally, a dictionary or other reference store may include information that is a function of a signal evolution. For example, two signal evolutions may be combined into a different piece of information. Similarly, a single signal evolution may be transformed into a different piece of information. Both signal evolutions and information derived from, computed from, or that is otherwise a function of a signal evolution may be stored. Additionally, in one embodiment, a dictionary or other reference store may include information that did not start as a signal evolution or that is not derived from a signal evolution.

In one embodiment, baseline signatures can be associated with materials that were analyzed solely for producing baseline signatures. For example, a beaker of water may be analyzed for a period of time using varied sequence blocks that produce a signal evolution. Similarly, a beaker of fat, a bone, a prosthetic hip, or other things that resonate may be analyzed, and signal evolutions retrieved from these items in response to applying selected combinations of varied echo splitting sequence blocks over time under selected combinations of varied conditions. These signals may be used as baseline signatures for other objects that are analyzed.

In another embodiment, baseline signatures can be acquired from the object being analyzed. Volumes in the object may be imaged using a conventional technique and may also be subjected to MRF with echo splitting. For example, 1% of a leg may be imaged conventionally and also processed using example MRF with echo splitting to establish baseline signatures for bone and other tissues. The 1% may be processed to calibrate an apparatus or method. With the calibration and baseline signatures acquired, the remaining 99% may be analyzed using MRF with echo splitting that relies on the baseline signatures established by processing the 1%. Even if some volumes produce a signal for which no fingerprinting match can be made, those volumes may still be analyzed using a conventional approach. Thus, in one embodiment, a combination conventional and fingerprinting approach may be used to establish signatures and for calibration. Similarly, in one embodiment, a combination of echo splitting MRF and non-echo splitting MRF may be employed.

Using pattern matching to compare acquired signal evolutions to known signal evolutions may include analyzing a cross-correlation between signal evolutions of different tissues acquired using sequence blocks having different parameters. Ideally, a signal evolution would fit to exactly one member of the multi-dimensional set of known evolutions. However, a signal evolution may have relationships with more than one reference signal. Thus, in one embodiment, a result of comparing a signal evolution to a reference signal may be an identification of a reference signal with which the signal evolution is related and a measurement characterizing the relationship. For example, a signal evolution may be identified as matching a reference signal to within a desired tolerance. Similarly, a signal evolution may be identified as being x % likely to match a reference signal. In another embodiment, a signal evolution may be identified as being a weighted sum of a number of reference signals. One dimension of the multi-dimensional set could, for example, be associated with a first set of acquisition and/or excitation parameters while a second dimension of the multi-dimensional set could, for example, be associated with a second set of excitation and/or acquisition parameters. Over time, the members of the multi-dimensional set could be adapted based on fits that are achieved from live data. Over time, sequence blocks and/or combinations of sequence blocks that yield a more identity-matrix like result may be favored over sequence blocks that yield a matrix with more off-diagonal contributions. This adaptation of sequence blocks and/or series of sequence blocks based on observed results may contribute, for example, to calibrating a particular NMR apparatus for MRF with echo splitting.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores signals, instructions and/or data. A computer-readable storage medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable storage medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 3:
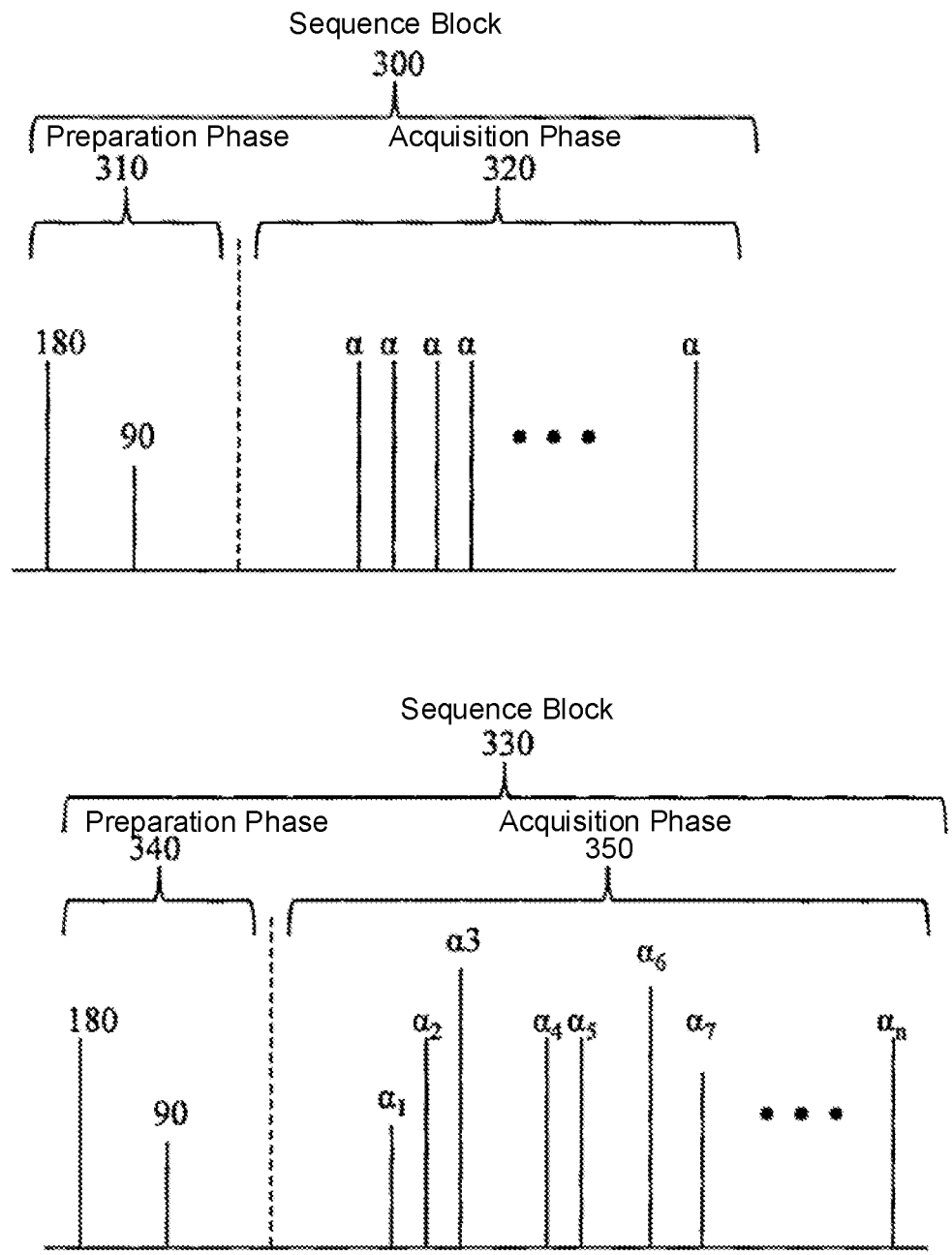
FIG. 3 compares and contrasts conventional sequence blocks to MRF sequence blocks.

FIG. 3 compares and contrasts conventional sequence blocks to sequence blocks that have been used in non-echo splitting MRF approaches. Sequence block 300 includes a preparation phase 310 and an acquisition phase 320. During acquisition phase 320, multiple acquisitions using the same flip angle and the same interval between acquisitions may be performed. Acquisition phase 320 resembles approaches that acquire data from a (k, t) space, where k refers to k-space and t refers to time, where t varies either constantly or linearly. The constant variation facilitates acquiring signal with constant amplitude and phase as required for conventional image reconstruction.

Sequence block 330 also includes a phase 340 and an acquisition phase 350. Notice that acquisition phase 350 is much longer than acquisition phase 320. Unlike acquisition phase 320 where parameters are either fixed or vary linearly, in acquisition phase 350 the parameters may vary widely, either non-linearly, randomly, and/or pseudo-randomly. Parameters that may vary include, but are not limited to, echo time, flip angle, phase encoding, and others. Note also that while phase 340 may, in some examples, be a preparation phase or preparation-like phase, that phase 340 does not necessarily perform a conventional preparation.

Figure 9:
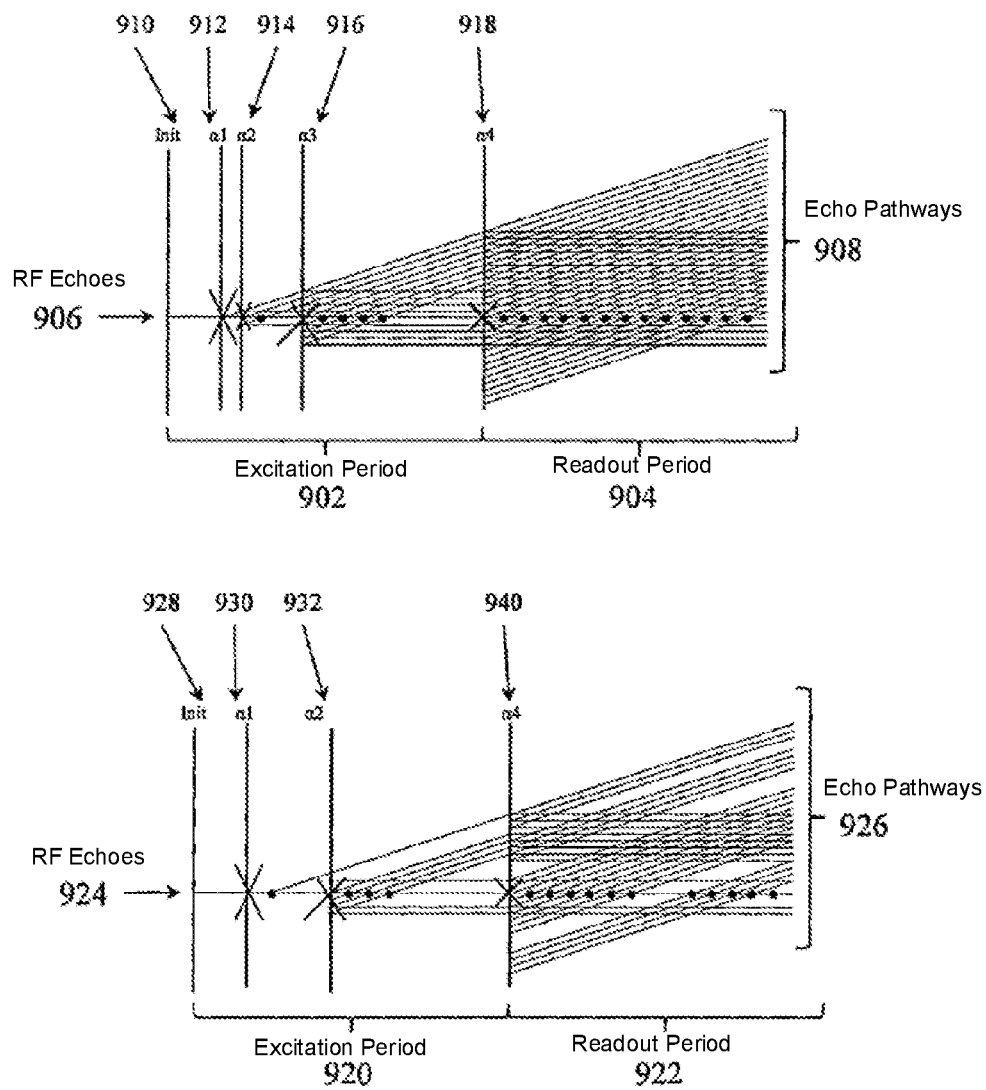
FIG. 9 illustrates different sets of multiple echo pathways produced by different echo splitting blocks in an MRF with echo splitting sequence.

FIG. 1 illustrates an echo splitting sequence and FIG. 9 illustrates two different echo splitting sequences. Like sequence 330 can vary in different parameters, so too can blocks in echo splitting sequences. For example, different sequence blocks in different an echo splitting MRF pulse sequence may vary in the number of echo splitting RF pulses, spacings between echo splitting RF pulses, or flip angles for echo splitting RF pulses.

FIG. 9 illustrates different sets of multiple echo pathways produced by different echo splitting blocks in an MRF with echo splitting sequence. A first portion of an echo splitting pulse sequence includes an excitation period 902 and a readout period 904. A second portion of the echo splitting pulse sequence also includes an excitation period 920 and a readout period 922. However, excitation period 902 includes four RF pulses 910, 912, 914, and 916 and is terminated by a refocusing pulse 918 while excitation period 920 includes three RF pulses 928, 930 and 932 and is terminated by a refocusing pulse 940. While refocusing pulses 918 and 940 are illustrated, in one embodiment these refocusing pulses may not be present. Note that the spacings between RF pulses 910, 912, 914, and 916 are different than the spacings between RF pulses 928, 930, and 932. The different excitations produce different echo splitting. For example, the four x's and seventeen o's on line 906 represent four RF echoes and seventeen spin echoes generated in response to the first portion of the echo splitting pulse sequence. The three x's and fifteen o's on line 924 represent RF echoes and spin echoes generated in response to the second portion of the echo splitting pulse sequence.

Figure 4:
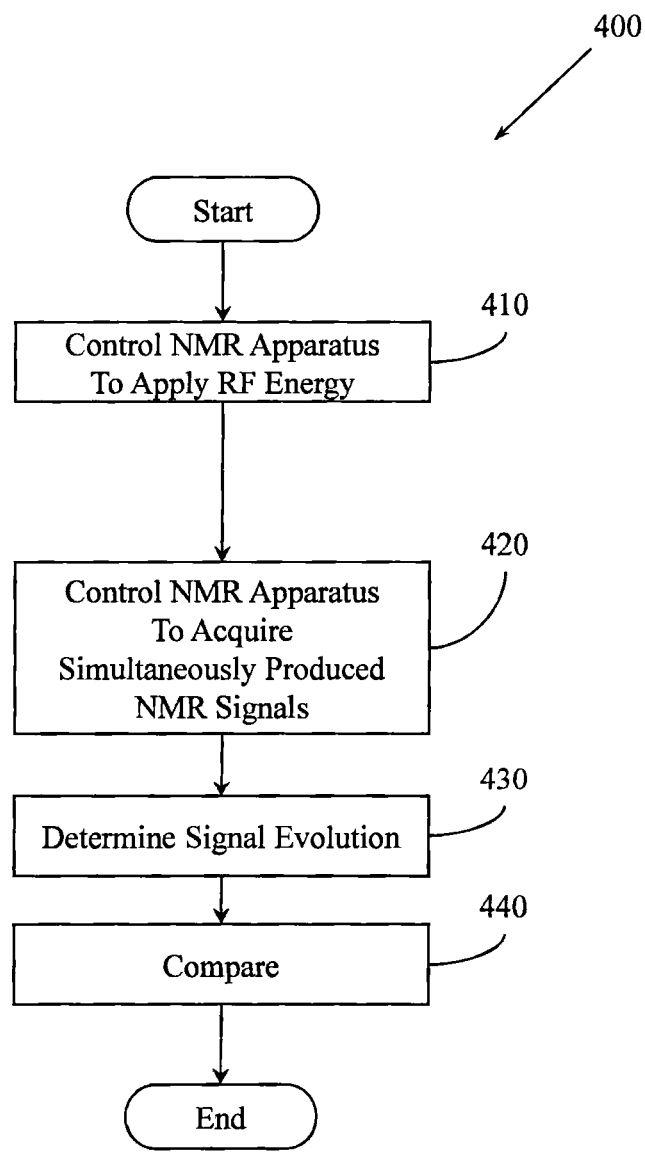
FIG. 4 illustrates an example method associated with MRF using echo splitting.

FIG. 4 illustrates a method 400 associated with MRF using echo splitting. Method 400 includes, at 410, controlling an NMR apparatus to apply RF energy to a volume in an object according to an echo splitting pulse sequence. The echo splitting pulse sequence may include variable sequence blocks. The volume may contain one or more resonant species. In one embodiment, the object may be a human and thus resonant species may include, but are not limited to, tissue, fat, water, hydrogen, and other species.

The RF energy may be applied using an echo splitting technique. Different sequence blocks in the pulse sequence may vary in a number of parameters including, but not limited to, the number of echo splitting RF pulses, spacings between echo splitting RF pulses, flip angles for echo splitting RF pulses, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. In different embodiments two, three, four, or more parameters may vary between sequence blocks. In different embodiments, the number of parameters varied between sequence blocks may itself vary. For example, A1 (sequence block 1) may differ from A2 in five parameters, A2 may differ from A3 in seven parameters, and A3 may differ from A4 in two parameters. One skilled in the art will appreciate that there are a nearly infinite number of series of sequence blocks that can be created by varying this large number of parameters. in one embodiment, a series of sequence blocks is crafted so that the series have different amounts (e.g., 1%, 2%, 5%, 10%, 50%, 99%, 100%) of unique sequence blocks as defined by their varied parameters. In different embodiments, a series of sequence blocks may include more than ten, more than one hundred, more than one thousand, more than ten thousand, and more than one hundred thousand sequence blocks.

The RF energy applied during a sequence block is configured to simultaneously produce individual NMR signals along multiple echo paths. In one example, at least one member of a series of variable sequence blocks will differ from at least one other member of the series of variable sequence blocks in at least N sequence block parameters, N being an integer greater than one. One skilled in the art will grasp that the signal content of a signal evolution may vary directly with N. Thus, as more parameters are varied, a potentially richer signal is retrieved. Conventionally, a signal that depends on a single parameter is desired and required to facilitate imaging. Here, acquiring signals with greater information content facilitates producing more distinct and identifiable signal evolutions.

In one embodiment, the NMR apparatus may be controlled at 410 to apply members of the series of variable sequence blocks according to a partially random acquisition plan configured to under-sample the object at an under-sampling rate R. In different embodiments, rate R may be, for example, two, four, or greater.

Method 400 also includes, at 420, controlling the NMR apparatus to acquire the simultaneously produced individual NMR signals. Unlike conventional systems where the time during which an NMR signal can be acquired is severely limited (e.g., 4-5 seconds), the NMR apparatus can be controlled to acquire NMR signal for significantly longer periods of time. For example, the NMR apparatus can be controlled to acquire signal for up to ten seconds, for up to twenty seconds, for up to one hundred seconds, or longer. NMR signals can be acquired for longer periods of time because signal information content remains viable for longer periods of time in response to the series of varied RF energy applied at 410. In different embodiments, the information content in the signal evolution may remain above an information content threshold for at least five seconds, for at least ten seconds, for at least sixty seconds, or for longer. An information content threshold may describe, for example, the degree to which a subsequent signal acquisition includes information that can be retrieved and that differs from information acquired in a previous signal acquisition. For example, a signal that has no retrievable information would likely fall below an information content threshold while a signal with retrievable information that differs from information retrieved from a previous signal would likely be above the information content threshold.

Method 400 also includes, at 430, controlling the NMR apparatus to determine a signal evolution from the acquired NMR signals. In one example, since multiple echo paths may be available, multiple signal evolutions may be computed. Determining the signal evolution may include storing (k, t, E) space data points acquired during action 420, where k refers to k-space, t refers to time, and E includes at least one of T1, T2, and one other parameter, where T1 is spin-lattice relaxation and T2 is spin-spin relaxation. In one embodiment, an individual sequence block may yield a single point in (k, t, E) space. A signal evolution may be determined by a series of variable sequence blocks. In another embodiment, an individual sequence block with echo splitting may produce a signal evolution all on its own.

Over time, series of variable sequence blocks that yield particularly useful signal evolutions may be identified. When an echo splitting technique is employed, multiple signal evolutions may be acquired and determined simultaneously.

In one embodiment, the simultaneously produced signals are acquired at 420 over a first period of time and the signal evolution is determined at 430 over a second period of time. In different embodiments, the first period of time may be ten seconds or longer, sixty seconds or longer, and even longer. Additionally, in different embodiments, the second period of time may be ten seconds or longer, sixty seconds or longer, and even longer.

Method 400 also includes, at 440, controlling the NMR apparatus to compare first information to reference information. The first information may be, for example, the signal evolution(s). The reference information may be, for example, known, stored, simulated, and/or predicted signal evolutions. The reference information may also include information that is produced as a function of a known, stored, simulated, or predicted signal evolution. The reference information may be produced by, for example, transforming a signal evolution, combining signal evolutions, decomposing signal evolutions, and other operations. In different examples, the "stored" signal evolutions may include previously acquired signals, simulated signals, or both. In one embodiment, the stored signal evolutions are associated with signals not acquired from the object while in another embodiment the stored signal evolutions are associated with signals acquired from the object. In one embodiment, the stored signals may be associated with signals acquired from the object being analyzed and signals not acquired from the object being analyzed.

The stored signals and information derived from reference signal evolutions may be associated with a potentially very large data space. Thus, one skilled in the art will appreciate that the stored signal evolutions and information derived from reference signal evolutions may include signals outside the set of signal evolutions characterized by:

$$SE = A - Be^{-t/C}$$

where:
SE is a signal evolution,
A is a constant,
B is a constant,
t is time, and
C is a single relaxation parameter.

Indeed, one skilled in the art will appreciate that the very large data space for signal evolutions can be partially described by:

$$SE = \prod_{i=1}^{N_A} \sum_{j=1}^{N_{RF}} R_i(\alpha) R_{RF_{ij}}(\alpha, \varphi) R(G) E_i(T1, T2, D)$$

where:
SE is a signal evolution,
$N_A$ is a number of sequence blocks,
$N_{RF}$ is a number of RF pulses in a sequence block,
$\alpha$ is a flip angle,
$\phi$ is a phase angle,
Ri($\alpha$) is a rotation due to off resonance,
$R_{RF_{ij}}(\alpha,\phi)$ is a rotation due to RF differences,
R(G) is a rotation due to a gradient,
T1 is spin-lattice relaxation,
T2 is spin-spin relaxation,
D is diffusion relaxation, and
$E_i$(T1, T2, D) is associated with magnetization changes.

While $E_i$(T1, T2, D) is provided as an example, one skilled in the art will appreciate that in different embodiments, $E_i$(T1, T2, D) may actually be $E_i$(T1, T2, D, . . . ), or $E_i$(T1, T2, . . . ).

In one example, the summation on j could be replaced by a product on j, e.g.:

$$SE = \prod_{i=1}^{N_A} \prod_{j=1}^{N_{RF}} R_i(\alpha) R_{RF_{ij}}(\alpha,\phi) R(G) E_i(T1,T2,D).$$

In NMR, MRI, or ESR (electron spin resonance), a Bloch equation is a member of a set of macroscopic equations that are used to calculate the nuclear magnetization $M=(M_x, M_y, M_z)$ as a function of time when relaxation times $T_1$ and $T_2$ are present. These phenomenological equations were introduced by Felix Bloch and may also be referred to as the equations of motion of nuclear magnetization. One skilled in the art will appreciate that in one embodiment Ri($\alpha$), $R_{RF_{ij}}$($\alpha,\phi$), and R(G) may be viewed as Bloch equations. Bloch equations may be used to produce simulated signal evolutions that may be stored in a library for comparison to acquired signal evolutions.

While FIG. 4 illustrates various actions occurring in serial, it is to be appreciated that various actions illustrated in FIG. 4 could occur substantially in parallel. By way of illustration, a first process could control applying RF energy, a second process could control acquiring NMR signals and determining a signal evolution, and a third process could perform comparisons. While three processes are described, it is to be appreciated that a greater and/or lesser number of processes could be employed.

Figure 5:
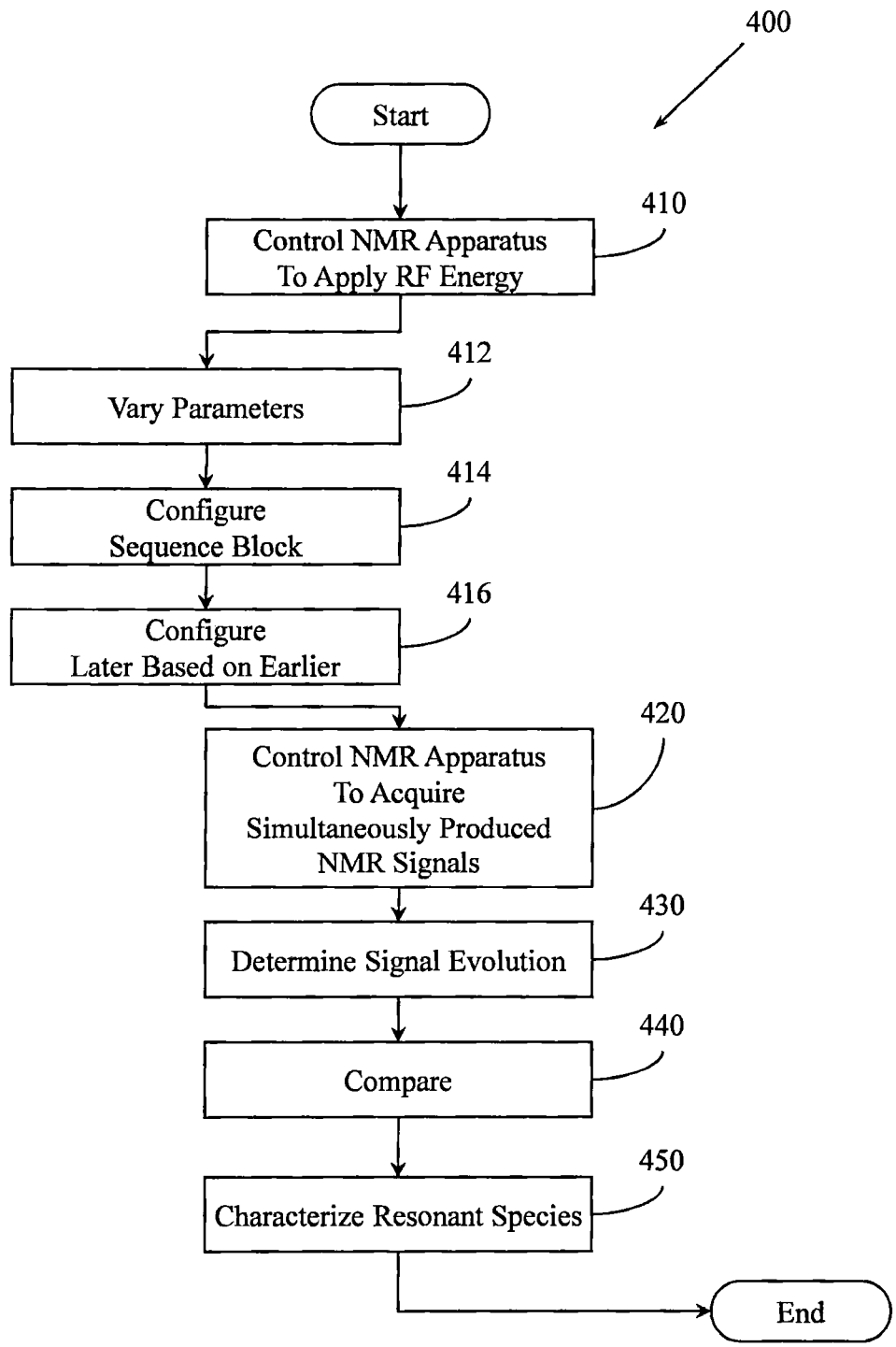
FIG. 5 illustrates an example method associated with MRF using echo splitting.

FIG. 5 illustrates another embodiment of method 400 (FIG. 4). This embodiment includes actions 410, 420, 430, and 440. However, this embodiment also includes actions 412, 414, 416, and 450.

This embodiment of method 400 includes, at 412, controlling the NMR apparatus to vary one or more of, the number of echo splitting pulses in a sequence block, the flip angles for the echo splitting pulses in a sequence block, the spacing between the echo splitting pulses in a sequence block, the amplitude of the echo splitting pulses, the amount of time between sequence blocks, the relative amplitude of sequence blocks, and the relative phase of sequence blocks. Thus, not only can the individual parameters (e.g., flip angle, phase) be varied within and between sequence blocks, but the times between sequence blocks and other differences between sequence blocks can be varied. This facilitates creating additional signal content in the signal evolution(s).

This embodiment of method 400 also includes, at 414, controlling the NMR apparatus to configure a member of the series of variable sequence blocks. The sequence may be, for example, a spiral QUEST sequence. Action 414 illustrates that a set of sequence blocks is not necessarily the same thing as a conventional pulse sequence. A sequence block differs from a conventional pulse sequence for at least the reason that non-linearly varying $\Delta t$ and $\Delta E$, which produce NMR signals in (k, t, E) space having non-constant amplitudes and phases are encouraged, not prohibited. A sequence block also differs from a conventional pulse sequence because of variable echo splitting pulses configured to produce variable echo splitting.

This embodiment of method 400 also includes, at 416, controlling the NMR apparatus to configure a later member of the series of variable sequence blocks based, at least in part, on an NMR signal acquired in response to applying an earlier member of the series of variable sequence blocks. Thus, this embodiment of method 400 is an adaptive method where the order of members of the series of varied sequence blocks may not be known ahead of time. Instead, as data points in (k, t, E) space are acquired, and as a signal evolves, decisions concerning different sequence blocks and different sets of parameters to vary may be made. By way of illustration, a first number of data points in (k, t, E) space and an evolving signal may be leading towards one relaxation parameter determination and away from another relaxation parameter determination. Therefore, sequence blocks that can confirm and/or reject either of these leads may be applied next in the series to facilitate a guided and more rapid convergence in the pattern matching process.

This embodiment of method 400 also includes, at 450, controlling the NMR apparatus to characterize at least one of the resonant species. In one embodiment, the characterizing may be a function of comparing the signal evolution to one or more stored (e.g., known, simulated, predicted) signal evolutions. Comparing the acquired signal evolution to a stored signal evolution may include, for example, controlling the NMR apparatus to compare the signal evolution to members of a multi-dimensional set of NMR signal evolutions. A first dimension in the multi-dimensional set may be associated with a first set of sequence block parameters and a second dimension in the multi-dimensional set may be associated with a second, different set of sequence block parameters. Since a signal evolution evolves over time, the multi-dimensional set may include a time dimension and the pattern matching process may include a path matching process that monitors the progress of the signal evolution. Additionally, since one series of varied sequence blocks may differ from another series of varied sequence blocks, the multi-dimensional set may include an order dimension where once again the pattern matching process may path match as opposed to just pattern matching.

Characterizing a resonant species may include, for example, identifying relaxation parameters including, but not limited to, T1 relaxation associated with the resonant species, T2 relaxation associated with the resonant species, off-resonance relaxation associated with the resonant species, and diffusion weighted relaxation associated with the resonant species. Characterizing a resonant species may also include, for example, identifying properties that are not relaxation parameters including, but not limited to, diffusion coefficients, spin density, proton density, magnetic field strength, gradient field strength, tissue type, and material type.

Figure 6:
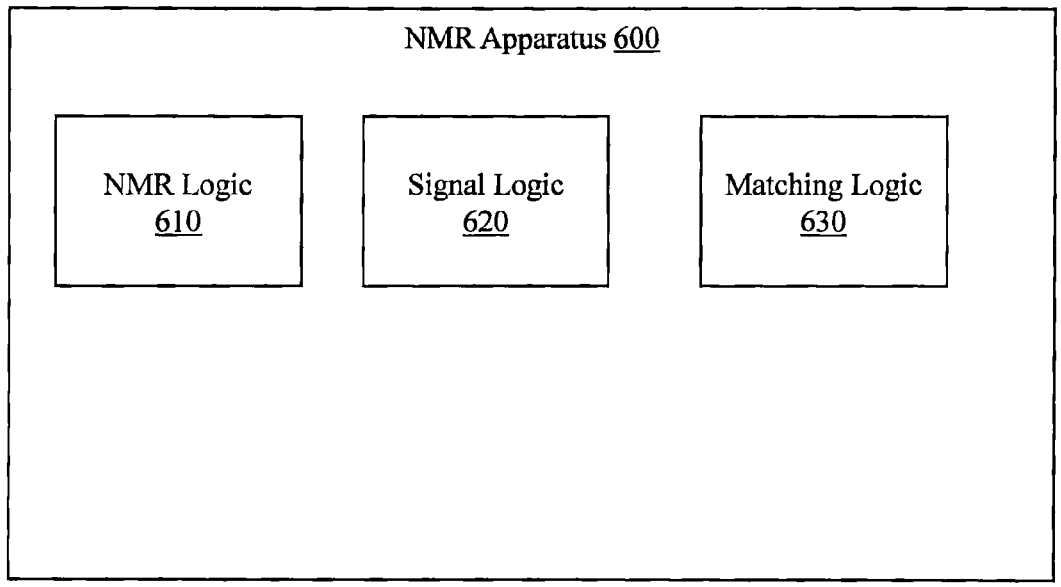
FIG. 6 illustrates an example apparatus associated with MRF using echo splitting.

FIG. 6 illustrates an NMR apparatus 600. NMR apparatus 600 includes an NMR logic 610. NMR logic 610 is configured to repetitively and variably sample an object in a (k, t, E) space using an echo splitting technique to acquire a set of NMR signals. Members of the set of NMR signals are associated with different points in the (k, t, E) space. In different embodiments the different points are sampled according to a plan where t and/or E varies non-linearly and/or in a non-constant manner.

NMR apparatus 600 also includes a signal logic 620. Signal logic 620 is configured to produce an NMR signal evolution from the NMR signals. Since multiple NMR signals may be acquired in parallel, multiple NMR signal evolutions may be produced in parallel. The signal evolution may include a number of NMR signals acquired over a period of time.

NMR apparatus 600 also includes a matching logic 630. Matching logic 630 is configured to compare produced NMR signal evolutions or information associated with the produced NMR signal evolutions to reference information. The reference information may be, for example, a previously acquired signal evolution, a simulated signal evolution, an item derived from a signal evolution other than the produced NMR signal evolution, and other information.

Figure 7:
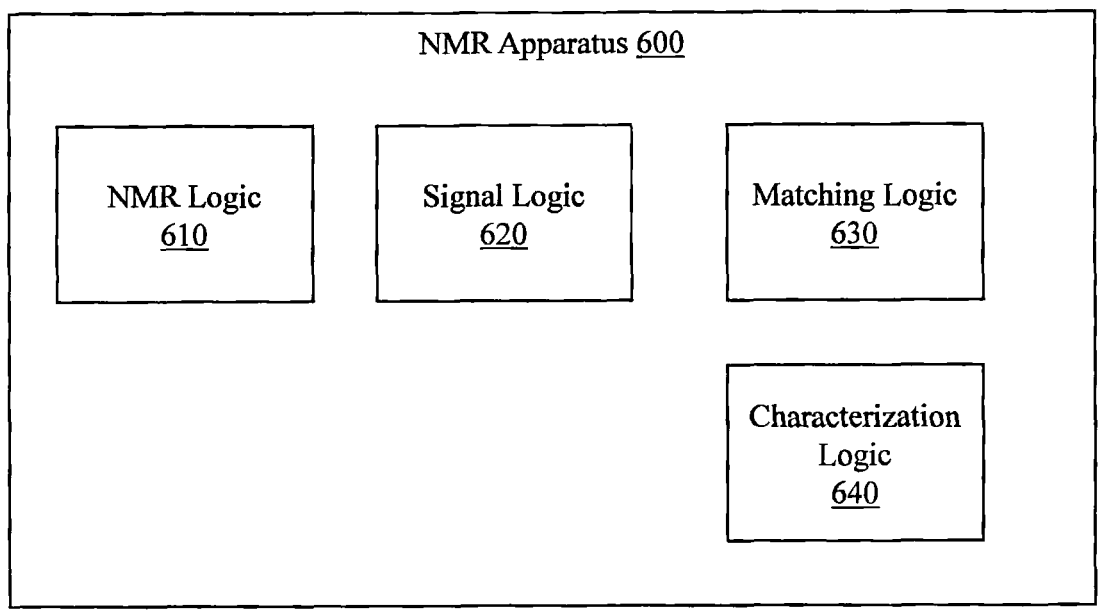
FIG. 7 illustrates an example apparatus associated with MRF using echo splitting.

FIG. 7 illustrates another embodiment of apparatus 600 (FIG. 6). This embodiment of apparatus 600 includes a characterization logic 640. Characterization logic 640 is configured to characterize a resonant species in the object. Characterizing the resonant species may include comparing the NMR signal evolutions or information derived from the NMR signal evolutions to reference information. The reference information may include, for example, a characterizing signal evolution(s), information derived from a characterizing signal evolution(s), and other information. Characterizing the resonant species may include identifying relaxation parameters including, but not limited to, T1 relaxation, T2 relaxation, diffusion weighted relaxation, and off-resonance relaxation. Characterizing the resonant species may also include identifying non-relaxation parameters including, but not limited to, diffusion co-efficient, spin density, proton density, tissue type, and material type.

In one embodiment, comparing the first set of data to the reference set of data may include, but is not limited to, pattern matching, selecting, minimizing, and optimizing. Pattern matching may include, but is not limited to, orthogonal matching pursuit, categorical sequence labeling, regression, clustering, classification, real valued sequence labeling, parsing, Bayesian methods, Markov methods, ensemble learning methods, and template matching. Optimization may include, but is not limited to, least squares optimization, regularized least squares optimization, basis pursuit optimization, and matching pursuit optimization.

While matching logic 630 (FIG. 6) and characterization logic 640 (FIG. 7) are illustrated as being part of NMR apparatus 600, in one embodiment, the matching logic 630 and/or the characterization logic 640 may reside in an apparatus separate from the NMR apparatus 600. In this embodiment, NMR apparatus 600 may provide NMR signals to the separate apparatus housing matching logic 630 and characterization logic 640. In one embodiment, matching logic 630 and characterization logic 640 may reside in separate apparatus.

Figure 8:
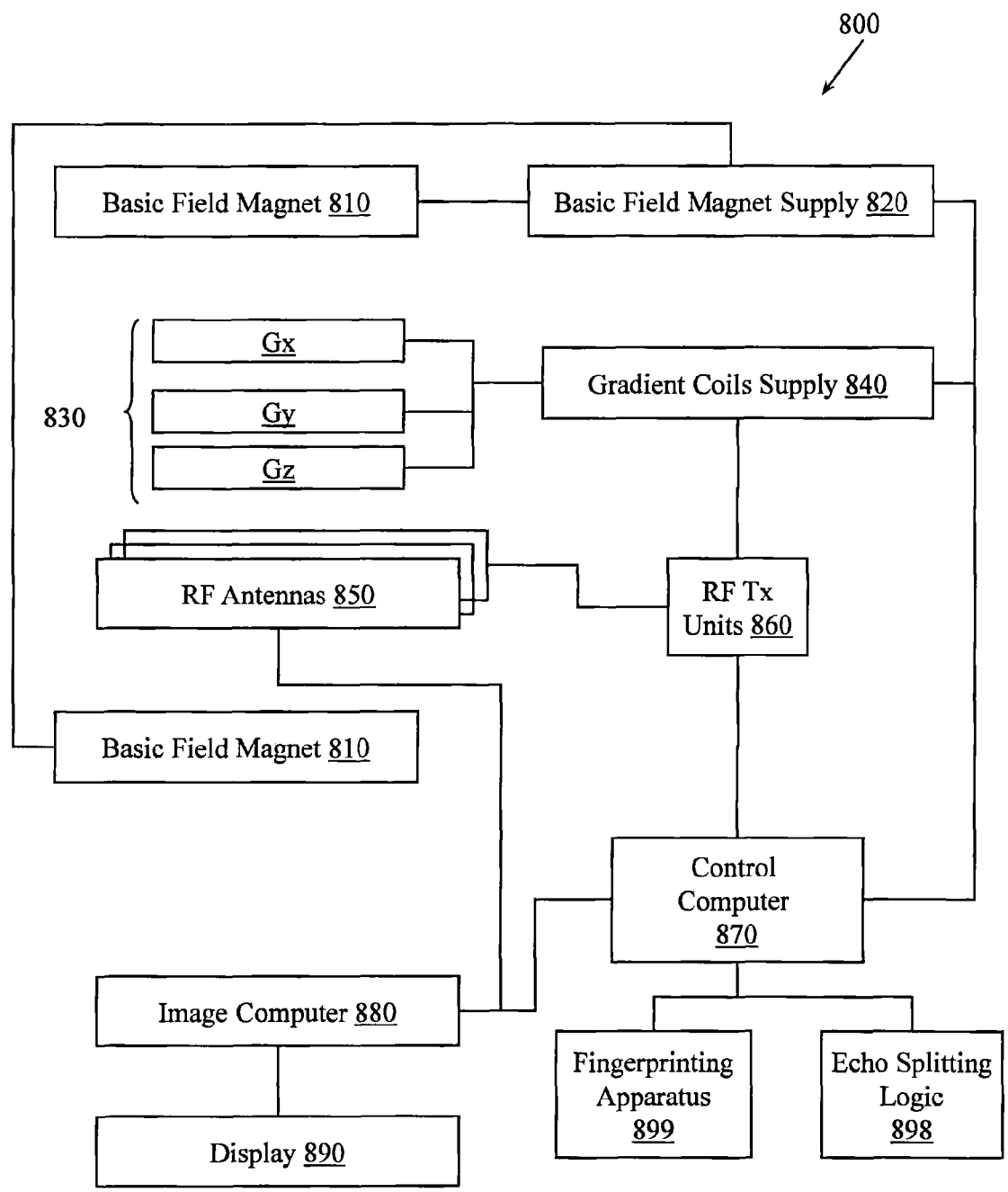
FIG. 8 illustrates an MR apparatus configured to perform MRF using echo splitting.

FIG. 8 illustrates an example MR apparatus 800 configured with a fingerprinting apparatus 899 to facilitate MRF. The fingerprinting apparatus 899 may be configured with elements of example apparatus described herein and/or may perform example methods described herein. While fingerprinting apparatus 899 is illustrated as part of MR apparatus 800, in one example, fingerprinting apparatus 899 may be a separate apparatus or apparatuses.

Apparatus 800 may also include an echo splitting logic 898 that is configured to facilitate performing MRF with the RF energy applied using an echo splitting technique. The echo splitting logic 898 may be configured with elements of example apparatus described herein and/or may perform example methods described herein. While logic 898 is illustrated as part of MR apparatus 800, in one example, logic 898 may be a separate apparatus or apparatuses.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being analyzed by the MR apparatus 800. MR apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that are configured to generate RF pulses and to receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

However, fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available. This facilitates producing a quantitative result.

While FIG. 8 illustrates an example MR apparatus 800 that includes various components connected in various ways, it is to be appreciated that other MR apparatus may include other components connected in other ways.

Figure 10A:
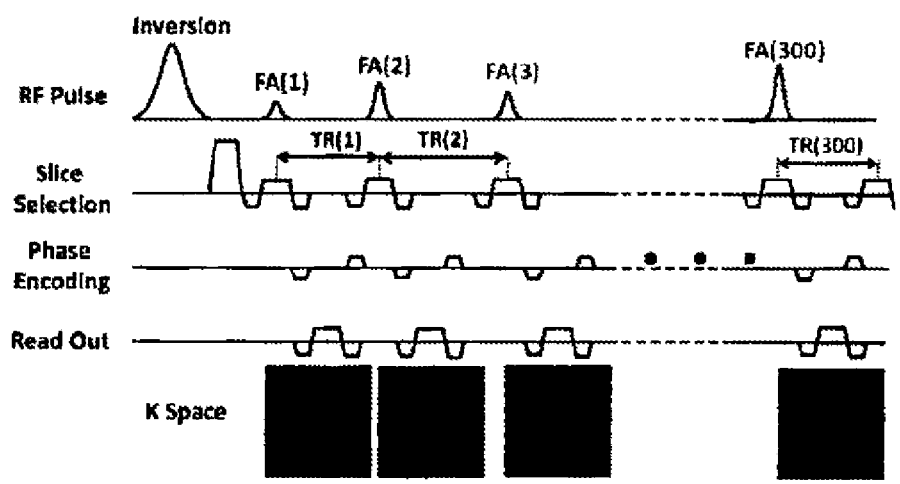
FIGS. 10a-10b illustrate an example magnetic resonance fingerprinting (MRF) sequence pattern.
Figure 10B:
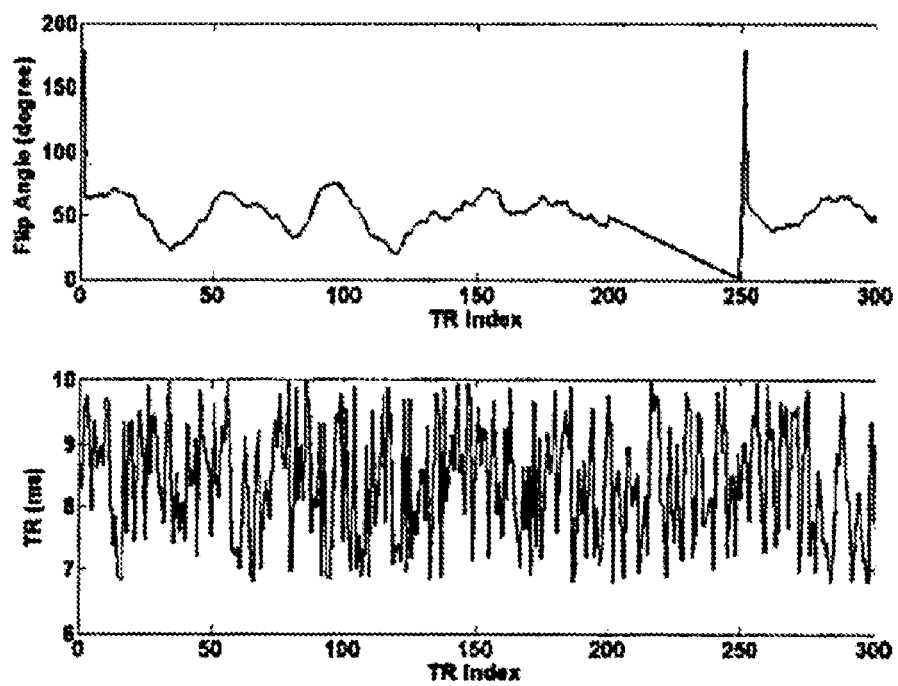

FIGS. 10*a*-10*b* illustrate an example MRF sequence pattern that has been used in other MRF experiments. In these figures, FA refers to flip angle and TR refers to repetition time. The terms nuclear magnetic resonance fingerprinting and magnetic resonance fingerprinting are used interchangeably herein. FIG. 10*a* illustrates an example acquisition sequence diagram where in different TR various sequence components are varied in a pseudorandom pattern. This basic acquisition scheme is illustrated being repeated with different spatial encoding gradients to fully encode an image for 300 TRs used for a sample complete acquisition. FIG. 10*b* illustrates an example of flip angle (FA) and repetition time (TR) patterns. While FIGS. 10*a* and 10*b* are associated with non-echo splitting techniques, both flip angles and repetition times may similarly be varied between sequence blocks in different echo splitting sequences. Additionally, the number of echo splitting RF pulses may be varied between echo splitting sequences. In one example, the angles used in the echo splitting RF pulses may also vary within a sequence and between sequences.

Figures 11A, 11B, 11C:
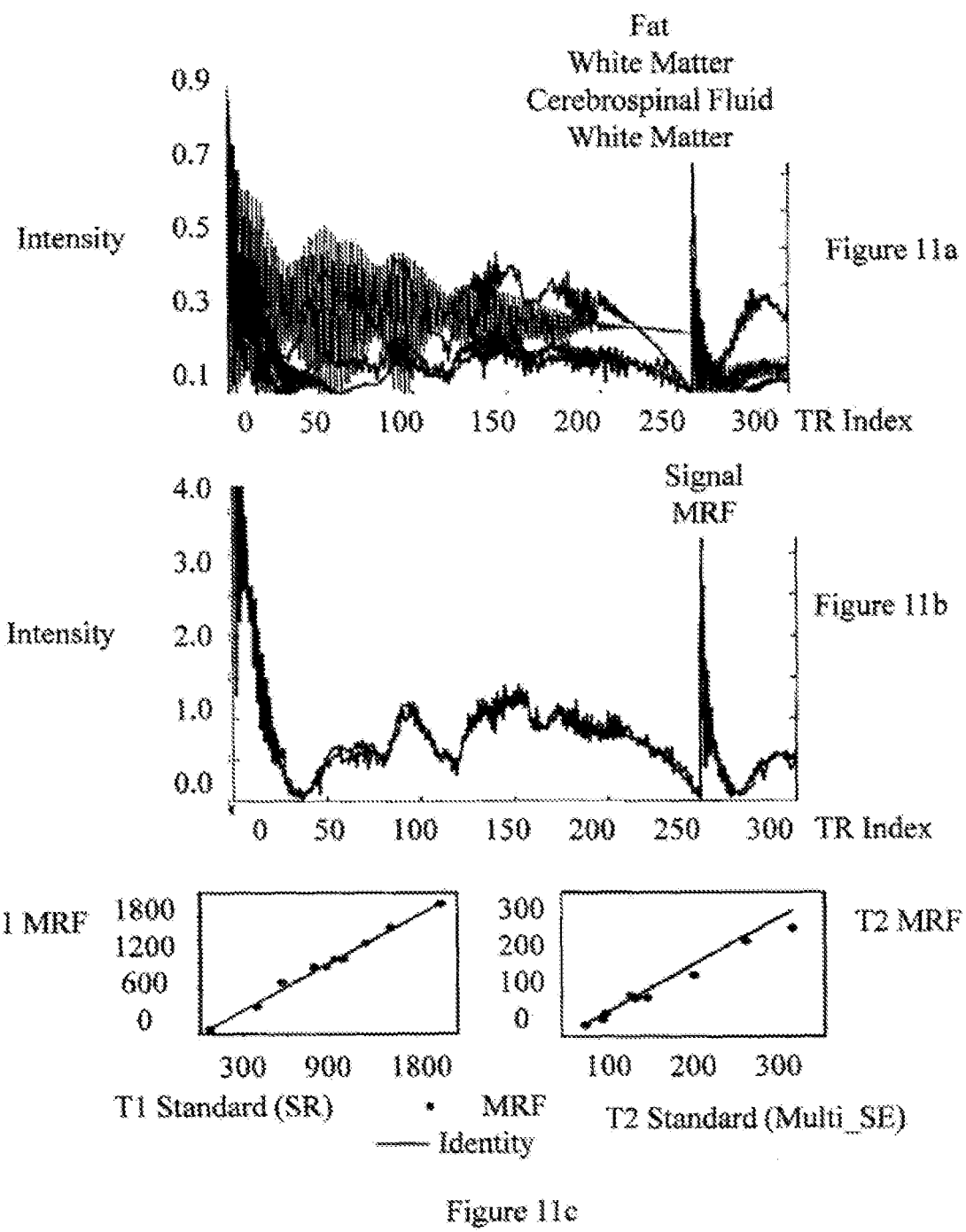
FIGS. 11a-11c illustrate example signal properties and matching results.

FIGS. 11*a*-11*c* illustrate example signal properties and matching results from conventional MRF. FIG. 11*a* illustrates example simulated signal evolution curves corresponding to four normal brain tissues. An example signal evolution curve from white matter with off-resonance is also plotted. FIG. 11*b* illustrates one example of acquired signal evolution curves and a comparison to a dictionary. The retrieved $T_1$, $T_2$, proton density and off-resonance values are 800 ms, 60 ms, 0.85e-5, and −4 Hz respectively. FIG. 11*c* illustrates $T_1$ and $T_2$ values retrieved from a matching algorithm. A comparison of signal from ten phantoms is illustrated with the values acquired from standard spin-echo sequences. The $R^2$ values for $T_1$ and $T_2$ comparisons are 0.9952 and 0.986 respectively. These images illustrate how conventional MRF may be susceptible to off-resonance in some circumstances. By comparison, MRF with echo splitting in general and QUEST MRF in particular may not be as susceptible to off-resonance.

Figure 12A:
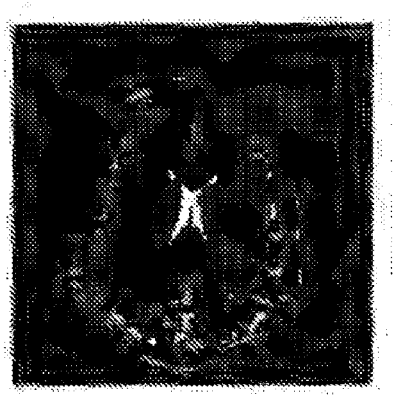
FIGS. 12a-12d illustrate example in vivo results associated with nuclear magnetic resonance (NMR) fingerprinting.
Figure 12B:
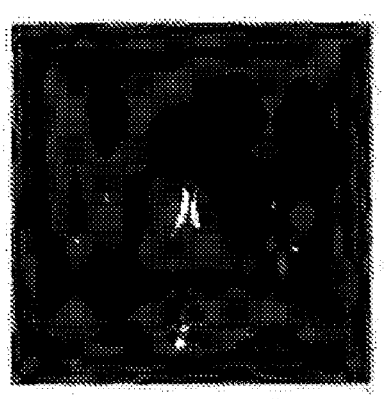
Figure 12C:
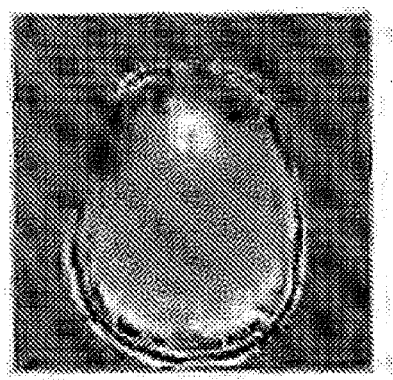
Figure 12D:
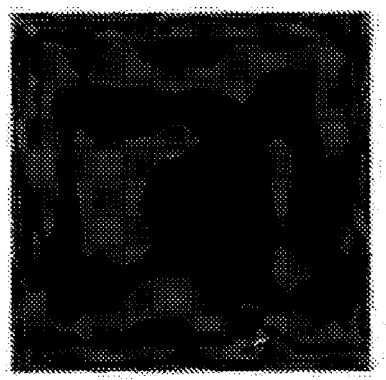

FIGS. 12*a*-12*d* illustrate in vivo results associated with another NMR fingerprinting experiment. FIG. 12*a* illustrates a T1 map (ms), FIG. 12*b* illustrates a T2 map (ms), FIG. 12*c* illustrates an off-resonance map (Hz), and FIG. 12*d* illustrates a proton density map. Information for producing FIGS. 12*a*-12*d* was acquired simultaneously using one example MRF approach.

A method comprises characterizing a property of a material exposed to a nuclear magnetic resonance (NMR) fingerprinting pulse sequence, where the pulse sequence includes an excitation period and a readout period, where the excitation period is configured to produce a magnetization in a resonant species in the material and to divide the magnetization to produce two or more different echo paths, where the excitation period comprises an initial RF pulse, and one or more echo splitting RF pulses, where the readout period includes a readout gradient configured to facilitate acquiring two or more echo paths, where characterizing the property comprises comparing first information associated with NMR signals acquired from the material in response to the pulse sequence to reference information associated with NMR fingerprinting, and where the first information includes two or more signal evolutions associated with the two or more different echo paths.

The method is also defined where the excitation period is configured to repeatedly divide the magnetization into different echo pathways.

The method is also defined where the excitation period is configured to divide the magnetization into $3^k$ echo paths, where k is the number of echo splitting RF pulses, k being an integer.

The method is also defined where the one or more echo splitting RF pulses are configured to produce two or more echo paths having different T1 and T2 weighting, where T1 is spin-lattice relaxation and where T2 is spin-spin relaxation.

The method is also defined where the pulse sequence is configured to cause the material to generate two or more parameter maps simultaneously. The method is also defined where the two or more parameter maps include a T1 map, a T2 map, an M0 map, a proton density map, a field map, a perfusion map, or a diffusion map, where T1 is spin-lattice relaxation, T2 is spin-spin relaxation, and M0 is magnetization.

The method is also comprising controlling an NMR apparatus to apply a constant readout gradient during the readout period.

The method is also comprising configuring the pulse sequence to separate echo pathways by increasing the delay between echo splitting RF pulses.

The method is also comprising controlling an NMR apparatus to apply the NMR fingerprinting pulse sequence. The method is also defined where the pulse sequence includes a series of variable sequence blocks, where a sequence block includes one or more excitation periods and one or more readout periods, where at least one member of the series of variable sequence blocks differs from at least one other member of the series of variable sequence blocks in at least N sequence block parameters, N being an integer greater than one. The method is also defined where the sequence block parameters comprise, the number of echo splitting RF pulses, the time between echo splitting RF pulses, and the flip angle of echo splitting RF pulses. The method is also defined where the excitation period includes at least a first echo splitting RF pulse, a second echo splitting RF pulse, and a third echo splitting RF pulse, and where the spacing between the first echo splitting RF pulse and the second echo splitting RF pulse is less than the spacing between the second echo splitting RF pulse and the third echo splitting RF pulse. The method is also comprising, upon determining that a set of echo pathways have been established in response to the pulse sequence, reconfiguring the pulse sequence to have constant spacing between subsequent echo splitting RF pulses. The method is also defined where the sequence block parameters comprise, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. The method is also defined where N is greater than two and where at least one percent of the members of the series of variable sequence blocks are unique.

The method is also defined where the flip angles of the one or more echo splitting RF pulses are not an integer multiple of 90°. The method is also defined where the one or more echo splitting RF pulses are configured to split a single path $M_{xy}^+$, of arbitrary phase $\phi$, into paths including: $M_{xy}^+$ with unchanged phase $\phi$ and inverted phase $-\phi$, $M_{xy}^{*+}$ with unchanged phase $\phi$ and inverted phase $-\phi$, $M_z^+$ and of phase $|\phi|$.

The method is also defined where characterizing the property of the material includes providing information concerning one or more of, T1 associated with the material, T2 associated with the material, a diffusion resonant frequency, a diffusion coefficient associated with the material, a spin density associated with the material, a proton density associated with the material, a magnetic field to which the material was exposed, a gradient field to which material was exposed, a tissue type of the material, and an identification of the material, T1 being spin-lattice relaxation, and T2 being spin-spin relaxation. The method is also defined where characterizing the property of the material includes one or more of, identifying a portion of the reference information related to the first information, identifying a degree to which a portion of the reference information is related to the first information, and identifying the likelihood that a portion of the reference information is related to the first information.

The method is also defined where the first information includes one or more of, the NMR signals acquired from the material in response to the pulse sequence, a signal evolution produced from the NMR signals acquired from the material in response to the pulse sequence, and information derived from the signal evolution produced from the NMR signals acquired from the material in response to the pulse sequence.

The method is also defined where the information derived from the signal evolution includes one or more of, information derived by transforming the signal evolution, information derived by combining the signal evolution with one or more other signal evolutions, and information derived by decomposing the signal evolution.

The method is also defined where the reference information includes one or more of, a previously acquired NMR signal, a modeled NMR signal, a previously acquired signal evolution, a modeled signal evolution, information derived from a reference signal evolution, and non-signal evolution information. The method is also defined where the information derived from the reference signal evolution includes one or more of, information derived by transforming the reference signal evolution, information derived by combining the reference signal evolution with one or more other reference signal evolutions, and information derived by decomposing the reference signal evolution. The method is also defined where the reference information includes one or more simulated signals computed as a function of Bloch equations. The method is also defined where the reference information includes one or more simulated signals having T1 in the range of 50-5000 ms, T1 being spin-lattice relaxation. The method is also defined where the reference information includes or more simulated signals having T2 in the range of 10-1000 ms, T2 being spin-spin relaxation.

The method is also defined where comparing the first information to the reference information includes one or more of, pattern matching, selecting, minimizing, and optimizing. The method is also defined where pattern matching includes one or more of, orthogonal matching pursuit, categorical sequence labeling, regression, clustering, classification, real valued sequence labeling, parsing, Bayesian methods, Markov methods, ensemble learning methods, and template matching. The method is also defined where optimization includes one or more of, least squares optimization, regularized least squares optimization, basis pursuit optimization, and matching pursuit optimization.

The method is also defined where the reference information includes signal evolutions outside the set of signal evolutions characterized by: $SE = A - Be^{-t/C}$, where: SE is a signal evolution, A is a constant, B is a constant, t is time, and C is a single relaxation parameter.

The method is also defined where the reference information includes signal evolutions selected from a set of signals described by:

$$SE = \prod_{i=1}^{N_A} \sum_{j=1}^{N_{RF}} R_i(\alpha) R_{RF_{ij}}(\alpha, \varphi) R(G) E_i(T1, T2, D)$$

where: SE is a signal evolution, $N_A$ is a number of sequence blocks, $N_{RF}$ is a number of RF pulses in a sequence block, $\alpha$ is a flip angle, $\phi$ is a phase angle, $R_i(\alpha)$ is a rotation due to off resonance, $R_{RF_{ij}}(\alpha\phi)$ is a rotation due to RF differences, $R(G)$ is a rotation due to a gradient, T1 is spin-lattice relaxation, T2 is spin-spin relaxation, D is diffusion relaxation, and $E_i(T1, T2, D)$ is associated with magnetization differences.

The method is also defined, where the reference information includes signal evolutions selected from a set of signals described by:

$$SE = \prod_{i=1}^{N_A} \sum_{j=1}^{N_{RF}} R_i(\alpha) R_{RF_{ij}}(\alpha, \varphi) R(G) E_i(T1, T2, \ldots)$$

where: SE is a signal evolution, $N_A$ is a number of sequence blocks, $N_{RF}$ is a number of RF pulses in a sequence block, $\alpha$ is a flip angle, $\phi$ is a phase angle, $Ri(\alpha)$ is a rotation due to off resonance, $R_{RF_{ij}}(\alpha, \phi)$ is a rotation due to RF differences, $R(G)$ is a rotation due to a gradient, T1 is spin-lattice relaxation, T2 is spin-spin relaxation, and $E_i(T1, T2, \ldots)$ is associated with magnetization changes.

The method is also defined, where the pulse sequence is a QUEST sequence.

The method is also defined, where the NMR signals are acquired from the material using a spiral trajectory.

The method is also defined, where the NMR signals are acquired from the material using a variable spiral trajectory.

The method is also defined, where the NMR signals are acquired from the material using a non-Cartesian trajectory or a Cartesian trajectory.

An apparatus comprises a first logic configured to receive a first set of data from an NMR apparatus configured to sample a (k, t, E) space associated with an object using an echo splitting technique to acquire a set of NMR signals, where members of the set of data are associated with different points in the (k, t, E) space, where k is k-space, where t is time, and where E includes at least one of, T1, T2, and one other parameter, T1 being spin-lattice relaxation, and T2 being spin-spin relaxation, and where one or more of, t, and E, vary non-linearly; a signal logic configured to produce an NMR signal evolution from the first set of data, and a characterization logic configured to characterize the object based, at least in part, on comparing the first set of data to a reference set of data.

The apparatus is also defined, where the echo splitting pulse sequence is configured to repeatedly divide a magnetization produced by a resonant species in the object.

The apparatus is also defined, where the echo splitting pulse sequence is configured to divide the magnetization $3^k$ echo paths, where k is the number of echo splitting RF pulses, k being an integer.

The apparatus is also defined, where the pulse sequence is configured to maximize the ratio of echoes produced by the pulse sequence to RF pulses in the pulse sequence.

The apparatus is also defined, where the pulse sequence includes unbalanced gradients. The apparatus is also defined, where the unbalanced gradients are unbalanced mono-polar gradients.

The apparatus is also defined, where the characterization logic is configured to provide image pixel data suitable for producing a diagnostic image, where the image pixel data is identified from comparisons between the first set of data and the reference set of data and between the reference set of data and the image pixel data.

The apparatus is also defined, where the characterization logic is configured to provide diagnostic information, where the diagnostic information is identified from comparisons between the first set of data and the reference set of data and between the reference set of data and the image pixel data.

The apparatus is also defined, where the (k, t, E) space is produced as a function of applying RF energy to the object according to two or more different echo splitting sequence blocks, where a sequence block includes one or more excitation phases and one or more readout phases where at least one member of the two or more sequence blocks differs from at least one other member of the two or more sequence blocks in at least one of, the number of echo splitting pulses in a sequence block, the spacing of echo splitting pulses in a sequence block, the phase of echo splitting pulses in a sequence block, and the amplitude of echo splitting pulses in a sequence block.

The apparatus is also defined, where the characterization logic is configured to provide information concerning one or more of, T1 associated with the object, T2 associated with the object, a diffusion coefficient associated with the object, a spin density associated with the object, a proton density associated with the object, a magnetic field to which the object was exposed, a gradient field to which the object was exposed, a tissue type of the object, and an identification of the object.

The apparatus is also defined, where the characterization logic is configured to identify one or more of, a portion of the reference set of data related to the first set of data, a degree to which a portion of the reference set of data is related to the first set of data, and the likelihood that a portion of the reference set of data is related to the first set of data.

The apparatus is also defined, where the first set of data includes one or more of, the NMR signals acquired from the object in response to the pulse sequence, a signal evolution produced from the NMR signals acquired from the object in response to the pulse sequence, and information derived from the signal evolution produced from the NMR signals acquired from the object in response to the pulse sequence, where the information derived from the signal evolution includes one or more of, information derived by transforming the signal evolution, information derived by combining the signal evolution with one or more other signal evolutions, and information derived by decomposing the signal evolution.

The apparatus is also defined, where the reference set of data includes one or more of, a previously acquired NMR signal, a modeled NMR signal, a previously acquired signal evolution, a modeled signal evolution, information derived from a reference signal evolution, and non-signal evolution information, where the information derived from the reference signal evolution includes one or more of, information derived by transforming the reference signal evolution, information derived by combining the reference signal evolution with one or more other reference signal evolutions, and information derived by decomposing the reference signal evolution.

The apparatus is also defined, where the characterization logic is configured to compare the first set of data to the reference set of data using one or more of, pattern matching, selecting, minimizing, and optimizing, where pattern matching includes one or more of, orthogonal matching pursuit, categorical sequence labeling, regression, clustering, classification, real valued sequence labeling, parsing, Bayesian methods, Markov methods, ensemble learning methods, and template matching, and where optimization includes one or more of, least squares optimization, regularized least squares optimization, basis pursuit optimization, and matching pursuit optimization.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one of, A, B, and C" is employed herein, (e.g., a data store configured to store one of, A, B, and C) it is intended to convey the set of possibilities A, B, and C, (e.g., the data store may store only A, only B, or only C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it is intended to convey the set of possibilities A, B, C, AB, AC, BC, ABC, AA . . . A, BB . . . B, CC . . . C, AA . . . ABB . . . B, AA . . . ACC . . . C, BB . . . BCC . . . C, or AA . . . ABB . . . BCC . . . C (e.g., the data store may store only A, only B, only C, A&B, A&C, B&C, A&B&C, or other combinations thereof including multiple instances of A, B, or C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method for characterizing a property of a material exposed to a nuclear magnetic resonance (NMR) fingerprinting pulse sequence, comprising:
    exposing, using an NMR apparatus, the material to the nuclear magnetic resonance (NMR) fingerprinting pulse sequence, where the pulse sequence includes:
        an excitation period comprises an initial RF pulse, and one or more echo splitting RF pulses, to produce a magnetization in a resonant species in the material and to divide the magnetization to produce two or more different echo paths,
        a readout period including a readout gradient configured to facilitate acquiring two or more echo paths,
    characterizing the property by comparing first information associated with NMR signals acquired from the material in response to the pulse sequence to reference information associated with NMR fingerprinting, where the first information includes two or more signal evolutions associated with the two or more different echo paths; and
    generating at least one map indicating the characterizing of the property of the material.

2. The method of claim 1, where the excitation period is configured to repeatedly divide the magnetization into different echo pathways.

3. The method of claim 1, where the excitation period is configured to divide the magnetization into $3^k$ echo paths, where k is the number of echo splitting RF pulses, k being an integer.

4. The method of claim 1, where the one or more echo splitting RF pulses are configured to produce two or more echo paths having different T1 and T2 weighting, where T1 is spin-lattice relaxation and where T2 is spin-spin relaxation.

5. The method of claim 1, where generating at least one map includes generating two or more parameter maps simultaneously.

6. The method of claim 5, where the two or more parameter maps include a T1 map, a T2 map, an M0 map, a proton density map, a field map, a perfusion map, or a diffusion map, where T1 is spin-lattice relaxation, T2 is spin-spin relaxation, and M0 is magnetization.

7. The method of claim 1, comprising controlling the NMR apparatus to apply a constant readout gradient during the readout period.

8. The method of claim 1, comprising configuring the pulse sequence to separate echo pathways by increasing the delay between echo splitting RF pulses.

9. The method of claim 1, comprising controlling the NMR apparatus to apply the NMR fingerprinting pulse sequence.

10. The method of claim 9, where the pulse sequence includes a series of variable sequence blocks, where a sequence block includes one or more excitation periods and one or more readout periods,
    where at least one member of the series of variable sequence blocks differs from at least one other member of the series of variable sequence blocks in at least N sequence block parameters, N being an integer greater than one.

11. The method of claim 10, where the sequence block parameters comprise, the number of echo splitting RF pulses, the time between echo splitting RF pulses, and a flip angle of echo splitting RF pulses.

12. The method of claim 11, where the excitation period includes at least a first echo splitting RF pulse, a second echo splitting RF pulse, and a third echo splitting RF pulse, and where the spacing between the first echo splitting RF pulse and the second echo splitting RF pulse is less than the spacing between the second echo splitting RF pulse and the third echo splitting RF pulse.

13. The method of claim 12, comprising, upon determining that a set of echo pathways have been established in response to the pulse sequence, reconfiguring the pulse sequence to have constant spacing between subsequent echo splitting RF pulses.

14. The method of claim 11, where the sequence block parameters comprise, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

15. The method of claim 10, where N is greater than two and where at least one percent of the members of the series of variable sequence blocks are unique.

16. The method of claim 1, where flip angles of the one or more echo splitting RF pulses are not an integer multiple of 90°.

17. The method of claim 16, where the one or more echo splitting RF pulses are configured to split a single path $M_{xy}^+$ of arbitrary phase $\phi$, into paths including:
$M_{xy}^+$ with unchanged phase $\phi$ and inverted phase $-\phi$.
$M_{xy}^{o+}$ with unchanged phase $\phi$ and inverted phase $-\phi$.
$M_z^+$ of phase $|\phi|$.

18. The method of claim 1, where characterizing the property of the material includes providing information concerning one or more of, T1 associated with the material, T2 associated with the material, a diffusion resonant frequency, a diffusion coefficient associated with the material, a spin density associated with the material, a proton density associated with the material, a magnetic field to which the material was exposed, a gradient field to which material was exposed, a tissue type of the material, and an identification of the material, T1 being spin-lattice relaxation, and T2 being spin-spin relaxation.

19. The method of claim 18, where characterizing the property of the material includes one or more of, identifying a portion of the reference information related to the first information, identifying a degree to which a portion of the reference information is related to the first information, and identifying the likelihood that a portion of the reference information is related to the first information.

20. The method of claim 1, where the first information includes one or more of, the NMR signals acquired from the material in response to the pulse sequence, a signal evolution produced from the NMR signals acquired from the material in response to the pulse sequence, and information derived from the signal evolution produced from the NMR signals acquired from the material in response to the pulse sequence.

21. The method of claim 20, where the information derived from the signal evolution includes one or more of, information derived by transforming the signal evolution, information derived by combining the signal evolution with one or more other signal evolutions, and information derived by decomposing the signal evolution.

22. The method of claim 1, where the reference information includes one or more of, a previously acquired NMR signal, a modeled NMR signal, a previously acquired signal evolution, a modeled signal evolution, information derived from a reference signal evolution, and non-signal evolution information.

23. The method of claim 22, where the information derived from the reference signal evolution includes one or more of, information derived by transforming the reference signal evolution, information derived by combining the reference signal evolution with one or more other reference signal evolutions, and information derived by decomposing the reference signal evolution.

24. The method of claim 22, where the reference information includes one or more simulated signals computed as a function of Bloch equations.

25. The method of claim 24, where the reference information includes one or more simulated signals having T1 in the range of 50-5000 ms, T1 being spin-lattice relaxation.

26. The method of claim 24, where the reference information includes one or more simulated signals having T2 in the range of 10-1000 ms, T2 being spin-spin relaxation.

27. The method of claim 1, where comparing the first information to the reference information includes one or more of, pattern matching, selecting, minimizing, and optimizing.

28. The method of claim 27, where pattern matching includes one or more of, orthogonal matching pursuit, categorical sequence labeling, regression, clustering, classification, real valued sequence labeling, parsing, Bayesian methods, Markov methods, ensemble learning methods, and template matching.

29. The method of claim 27, where optimization includes one or more of, least squares optimization, regularized least squares optimization, basis pursuit optimization, and matching pursuit optimization.

30. The method of claim 1, where the reference information includes signal evolutions outside the set of signal evolutions characterized by:

$$SE = A - Be^{-t/C}$$

where:
SE is a signal evolution,
A is a constant,
B is a constant,
t is time, and
C is a single relaxation parameter.

31. The method of claim 1, where the reference information includes signal evolutions selected from a set of signals described by:

$$SE = \prod_{i=1}^{N_A} \sum_{j=1}^{N_{RF}} R_i(\alpha) R_{RF_{ij}}(\alpha, \varphi) R(G) E_i(T1, T2, D)$$

where:
SE is a signal evolution,
$N_A$ is a number of sequence blocks,
$N_{RF}$ is a number of RF pulses in a sequence block,
$\alpha$ is a flip angle,
$\phi$ is a phase angle,
Ri($\alpha$) is a rotation due to off resonance,
$R_{RF_{ij}}(\alpha, \phi)$ is a rotation due to RF differences,
R(G) is a rotation due to a gradient,
T1 is spin-lattice relaxation,
T2 is spin-spin relaxation,
D is diffusion relaxation, and
$E_i$(T1, T2, D) is associated with magnetization differences.

32. The method of claim 1, where the reference information includes signal evolutions selected from a set of signals described by:

$$SE = \prod_{i=1}^{N_A} \sum_{j=1}^{N_{RF}} R_i(\alpha) R_{RF_{ij}}(\alpha, \varphi) R(G) E_i(T1, T2, \ldots)$$

where:
SE is a signal evolution,
$N_A$ is a number of sequence blocks,
$N_{RF}$ is a number of RF pulses in a sequence block,
$\alpha$ is a flip angle,
$\phi$ is a phase angle,
Ri($\alpha$) is a rotation due to off resonance,
$R_{RF_{ij}}(\alpha, \phi)$ is a rotation due to RF differences,
R(G) is a rotation due to a gradient, T1 is spin-lattice relaxation, T2 is spin-spin relaxation, and $E_i$(T1, T2, . . .) is associated with magnetization changes.

33. The method of claim 1, where the pulse sequence is a QUEST sequence.

34. The method of claim 1, where the NMR signals are acquired from the material using a spiral trajectory.

35. The method of claim 1, where the NMR signals are acquired from the material using a variable spiral trajectory.

36. The method of claim 1, where the NMR signals are acquired from the material using a non-Cartesian trajectory or a Cartesian trajectory.

37. An apparatus, comprising:
an NMR apparatus;
a computer system configured to:
  receive a first set of data from the NMR apparatus configured to sample a (k, t, E) space associated with an object using an echo splitting technique to acquire a set of NMR signals, where members of the set of data are associated with different points in the (k, t, E) space, where k is k-space, where t is time, and where E includes at least one of, T1, T2, or one other parameter, wherein T1 is spin-lattice relaxation, and T2 is spin-spin relaxation, and wherein one or more of, t, and E, vary non-linearly;
  produce an NMR signal evolution from the first set of data, and
  characterize the object based, at least in part, on comparing the first set of data to a reference set of data.

38. The apparatus of claim 37, where the echo splitting technique is configured to repeatedly divide a magnetization produced by a resonant species in the object.

39. The apparatus of claim 37, where the echo splitting technique is configured to divide the magnetization into $3^k$ echo paths, where k is the number of echo splitting RF pulses, k being an integer.

40. The apparatus of claim 37, where the echo splitting technique is configured to maximize a ratio of echoes produced by the pulse sequence to RF pulses in the pulse sequence.

41. The apparatus of claim 37, where the echo splitting technique includes unbalanced gradients.

42. The apparatus of claim 41, where the unbalanced gradients are unbalanced mono-polar gradients.

43. The apparatus of claim 37, where the computer system is configured to provide image pixel data suitable for producing a diagnostic image, where the image pixel data is identified from comparisons between the first set of data and the reference set of data and between the reference set of data and the image pixel data.

44. The apparatus of claim 43, where the computer system is configured to provide diagnostic information, where the diagnostic information is identified from comparisons between the first set of data and the reference set of data and between the reference set of data and the image pixel data.

45. The apparatus of claim 37, where the (k, t, E) space is produced as a function of applying RF energy to the object according to two or more different echo splitting sequence blocks, where a sequence block includes one or more excitation phases and one or more readout phases and wherein at least one member of the two or more sequence blocks differs from at least one other member of the two or more sequence blocks in at least one of a number of echo splitting pulses in a sequence block, a spacing of echo splitting pulses in a sequence block, the phase of echo splitting pulses in a sequence block, or an amplitude of echo splitting pulses in a sequence block.

46. The apparatus of claim 37, where the computer system is configured to provide information concerning one or more of, T1 associated with the object, T2 associated with the object, a diffusion coefficient associated with the object, a spin density associated with the object, a proton density associated with the object, a magnetic field to which the object was exposed, a gradient field to which the object was exposed, a tissue type of the object, and an identification of the object.

47. The apparatus of claim 37, where the computer system is configured to identify one or more of, a portion of the reference set of data related to the first set of data, a degree to which a portion of the reference set of data is related to the first set of data, and the likelihood that a portion of the reference set of data is related to the first set of data.

48. The apparatus of claim 37, where the first set of data includes one or more of, the NMR signals acquired from the object in response to a pulse sequence implementing the echo splitting technique, a signal evolution produced from the NMR signals acquired from the object in response to the pulse sequence, and information derived from the signal evolution produced from the NMR signals acquired from the object in response to the pulse sequence,
  where the information derived from the signal evolution includes one or more of, information derived by transforming the signal evolution, information derived by combining the signal evolution with one or more other signal evolutions, and information derived by decomposing the signal evolution.

49. The apparatus of claim 37, where the reference set of data includes one or more of, a previously acquired NMR signal, a modeled NMR signal, a previously acquired signal evolution, a modeled signal evolution, information derived from a reference signal evolution, and non-signal evolution information,
  where the information derived from the reference signal evolution includes one or more of, information derived by transforming the reference signal evolution, information derived by combining the reference signal evolution with one or more other reference signal evolutions, and information derived by decomposing the reference signal evolution.

50. The apparatus of claim 37, where the computer system is configured to compare the first set of data to the reference set of data using one or more of, pattern matching, selecting, minimizing, and optimizing,
  where pattern matching includes one or more of, orthogonal matching pursuit, categorical sequence labeling, regression, clustering, classification, real valued sequence labeling, parsing, Bayesian methods, Markov methods, ensemble learning methods, and template matching, and
  where optimization includes one or more of, least squares optimization, regularized least squares optimization, basis pursuit optimization, and matching pursuit optimization.

* * * * *

UNITED STATES PATENT AND TRADEMARK OFFICE
CERTIFICATE OF CORRECTION

PATENT NO. : 9,568,579 B2  
APPLICATION NO. : 14/024999  
DATED : February 14, 2017  
INVENTOR(S) : Renate Jerecic et al.

It is certified that error appears in the above-identified patent and that said Letters Patent is hereby corrected as shown below:

In the Specification

Column 1, Line 13 "This invention was developed, at least partially, with federal funding supplied under Federal Grant No. 1R01HL094557 provided by the NIH, Federal Grant No. 5K99EB011527 provided by the NIH, and Federal Grant No. 1KL2RR024990 provided by the NIH. The federal government has certain rights in the invetion" should be -- This invention was made with government support under EB011527, RR024990 and HL094557 awarded by the National Institutes of Health. The government has certain rights in the invention. --

Signed and Sealed this  
Ninth Day of April, 2019

Andrei Iancu  
*Director of the United States Patent and Trademark Office*